United States Patent
Allott et al.

(10) Patent No.: US 11,703,563 B2
(45) Date of Patent: Jul. 18, 2023

(54) SLIDING WINDOW AND DC OFFSET CORRECTION TECHNIQUE FOR PULSE DOPPLER RADAR SYSTEMS

(71) Applicant: Renesas Electronics America Inc., Milpitas, CA (US)

(72) Inventors: Stephen Allott, Milpitas, CA (US); Jonathan Gowing, Santa Cruz, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 51 days.

(21) Appl. No.: 17/031,135

(22) Filed: Sep. 24, 2020

(65) Prior Publication Data

US 2022/0091228 A1 Mar. 24, 2022

(51) Int. Cl.
*G01S 7/292* (2006.01)
*H03M 1/66* (2006.01)

(52) U.S. Cl.
CPC ............ *G01S 7/2926* (2013.01); *H03M 1/66* (2013.01)

(58) Field of Classification Search
CPC .... G01S 7/2926; G01S 7/4021; G01S 7/2923; G01S 13/0209; H03M 1/66
See application file for complete search history.

(56) References Cited

U.S. PATENT DOCUMENTS

| | | | | |
|---|---|---|---|---|
| 3,778,822 A * | 12/1973 | Bauer | G01S 7/292 342/93 |
| 5,585,756 A * | 12/1996 | Wang | G06G 7/1865 327/341 |
| 8,963,607 B1 * | 2/2015 | Oswal | H03K 5/003 327/307 |
| 10,164,593 B1 * | 12/2018 | Harwalkar | H03G 3/3068 |
| 2004/0157573 A1 * | 8/2004 | Lee | H03F 3/45995 455/240.1 |
| 2005/0250459 A1 * | 11/2005 | Tervaluoto | H04B 1/30 455/127.2 |
| 2005/0265428 A1 * | 12/2005 | McCorkle | G01S 7/0232 375/130 |
| 2006/0284671 A1 * | 12/2006 | Ohba | H03F 3/45977 330/9 |
| 2012/0274370 A1 * | 11/2012 | Fortier | H04B 17/11 327/156 |

(Continued)

OTHER PUBLICATIONS

"Ultra-Wideband Radar Technology," edited by James D. Taylor, CRC Press, Published Sep. 21, 2000, 424 pages (Summary of Book details retrieved from Publisher of Humanities, Social Science & STEM Books), pp. 1-3.

*Primary Examiner* — Erin F Heard
*Assistant Examiner* — Kenneth W Good
(74) *Attorney, Agent, or Firm* — Haynes and Boone, LLP

(57) ABSTRACT

A pulsed radar system is presented that includes a sliding window and DC offset. A method of pulsed DC radar operation, comprising an operation state, the operation state including initializing parameters for a current integration window; providing timing for the current integration window to an integrating filter based from a transmit pulse; providing a DC offset associated with the current integration window; and incrementing the current integration window to the next integration window to be timed from a next transmit pulse.

13 Claims, 16 Drawing Sheets

(56) References Cited

U.S. PATENT DOCUMENTS

| | | | | |
|---|---|---|---|---|
| 2013/0099943 | A1* | 4/2013 | Subramanya | G01S 13/91 340/933 |
| 2014/0120851 | A1* | 5/2014 | Steele | H04B 1/1036 455/90.2 |
| 2017/0023670 | A1* | 1/2017 | Jansen | G01S 13/343 |
| 2018/0175905 | A1* | 6/2018 | Nabki | H04B 1/385 |
| 2020/0186186 | A1* | 6/2020 | Savary | H04B 1/406 |
| 2020/0341131 | A1* | 10/2020 | You | G01S 7/352 |
| 2021/0072346 | A1* | 3/2021 | Bogner | G01S 13/584 |
| 2021/0149019 | A1* | 5/2021 | Subburaj | G01S 7/40 |
| 2021/0325509 | A1* | 10/2021 | Santra | G01S 13/88 |
| 2022/0018931 | A1* | 1/2022 | Kumar | G01S 7/10 |

\* cited by examiner

SLIDING WINDOW AND DC OFFSET CORRECTION TECHNIQUE FOR PULSE DOPPLER RADAR SYSTEMS

TECHNICAL FIELD

Embodiments of the present invention are related to radar radio receivers and, in particular, to a pulsed Doppler Radar system with a sliding window and DC offset correction.

DISCUSSION OF RELATED ART

Radar, which was originally an acronym for "Radio Detection And Ranging," has a rich history dating back to Heinrich Hertz's classical experiments in the 1880's. Today, radar systems exist for a variety of applications from weather observation to guidance systems and law enforcement. In its simplest form, a radar system consists of three subsystems: a transmitter, a receiver, and an antenna system. The transmitter generates an electrical signal that is radiated by the antenna system. If the signal is incident on a target, such as an airplane, rain, or a bird, it will be partially reflected back to the radar system and incident on the antenna system. The received signal will be routed by the antenna system to the receiver. The receiver processes the signal to determine the presence of a target, as well as target characteristics, such as range and velocity. Radar systems can be continuous-wave (CW) systems, where the transmitter broadcasts a continuous radio frequency or radar frequency (RF) signal, or a pulsed system, where the transmitter broadcasts a train of RF pulses with a system-specific carrier frequency, pulse repetition frequency (PRF), and duty cycle. This disclosure is directed to a pulsed system and, in particular, to a Pulse-Doppler radar system.

Pulse-Doppler radar refers to a radar system that determines the range to a target using a pulse-timing technique and determines the target speed using a Doppler effect. In such systems, the transmitter transmits a pulse of a particular duration and a first frequency and at a later time receives a return pulse reflected from the target that has a second frequency. In accordance with the Doppler effect, the speed of the target can be determined by a frequency shift of the return pulse compared with the transmitted pulse. Such a system can provide accurate measurements of location and speed.

However, signal processing in the receiver of a Pulsed-Doppler radar can prove difficult. Therefore, there is a need to develop better methods of processing signals in a Pulsed-Doppler receiver.

SUMMARY

A pulsed radar system is presented that includes a sliding window and DC offset. A method of pulsed DC radar operation, comprising an operation state, the operation state including initializing parameters for a current integration window; providing timing for the current integration window to an integrating filter based from a transmit pulse; providing a DC offset associated with the current integration window; and incrementing the current integration window to the next integration window to be timed from a next transmit pulse.

The pulsed radar system further includes a calibration state, wherein for each of a set of N integration windows, initializing integration window timing parameters for a current integration window; initialization a DC offset value for the current integration window; providing window timing to an integration filter; providing the DC offset value to a mixer coupled to provide a signal to the integration filter; receiving an output signal from the integration filter with a sample-and-hold (SAH) circuit; adjusting the DC offset values while monitoring a comparator output signal from a comparator coupled to receive a SAH signal from the SAH circuit until the DC offset values have converged; and storing the DC offset value associated with the current integration window.

These and other embodiments are discussed below with respect to the following figures.

These and other aspects of embodiments of the present invention are further discussed below.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description illustrates inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Figure 1A:
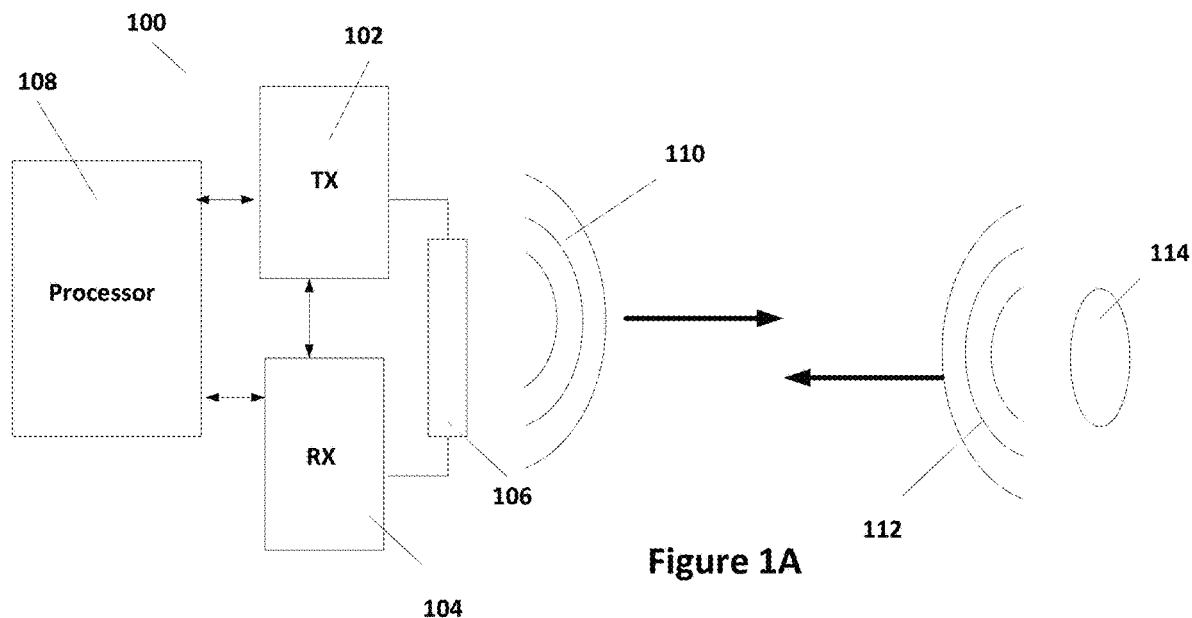
FIGS. 1A and 1B illustrate an example of a pulsed Doppler radar system.
Figure 1B:
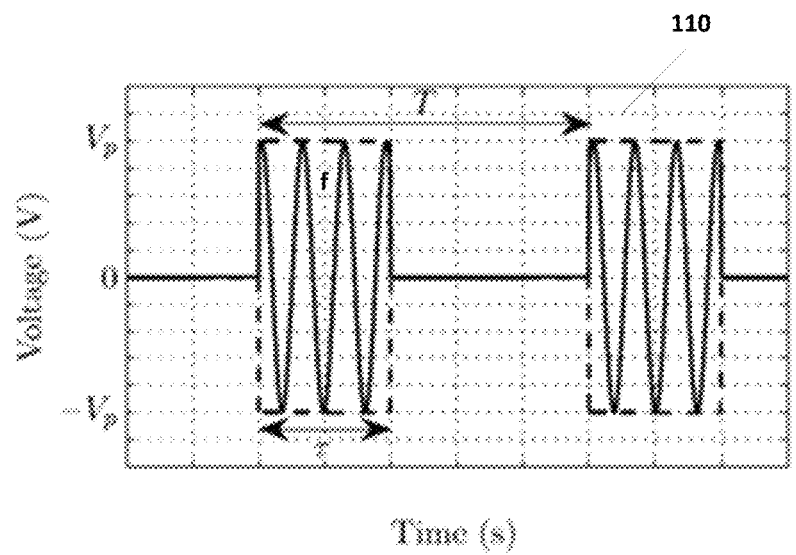

FIGS. 1A and 1B illustrate a block diagram of a pulsed radar system 100. As is illustrated in FIG. 1A, system 100 includes transmitter 102 coupled to a transmit antenna in antenna array 106 to provide a pulse 110. Pulse 110 is reflected from an object 114, resulting in a return pulse 112. Return pulse 112 is received by a receive antenna in antenna array 106 and the RF signal is provided to receiver 104. Transmitter 102 and receiver 104 may each be coupled to a processor 108, which provides control signals to transmitter 102 and receiver 104 as well as digitally analyzing signals received from receiver 104. In particular, transmitter 102 generates a pulse. At some later time, receiver 104 is activated to receive the return pulse 112. In most systems, receiver 104 is not active during pulse generation in transmitter 102.

FIG. 1B illustrates the transmitted pulsed wave 110 as is illustrated in FIG. 1A. The time-domain characteristic of pulsed wave 110 is an important consideration. The radar signal 110 can be a continuous-wave (CW) waveform or a pulsed waveform. The pulsed waveform 110 is illustrated in FIG. 1B. A CW transmitter broadcasts a continuous radio frequency or radar frequency (RF) signal and will not be further discussed in this disclosure. As is illustrated in FIG. 1B, a pulsed waveform 110 can be characterized with the period between pulses, the Periodic Repetition Interval (PRI) T, the width of the pulse r, and the frequency of the RF carrier wave signal in the pulse. Consequently, a pulsed transmitter broadcasts a train of RF pulses 110 with a system-specific carrier frequency, pulse repetition frequency (PRF), and duty cycle. The PRF is the frequency at which the RF pulses are transmitted and is equal to 1/T, where T is the time between transmitted pulses as shown in FIG. 1B. The system-specific carrier frequency is the frequency f of the RF radiation transmitted during the pulse, which has a duration of τ. The duty cycle is defined as the ratio τ:T, where r is the transmitted pulse-width. Pulsed waveform 110 can be incoherent or coherent. Pulsed waveform 110 is coherent if there is a deterministic phase relationship in the carrier wave from pulse to pulse.

Short-range radar can usually refer to radar to detect objects that are less than 100 ft distance from pulsed radar system 100. Short-range radar is a challenging design task because of the limited time frame associated with a moving target in close proximity to the radar system 100. A variety of architectures can be employed to implement a short-range radar. The primary architectures are frequency-modulated continuous-wave (FMCW) radar, pulse Doppler radar, and pulse compression radar. As discussed above, this disclosure is directed to pulse Doppler radar.

Figure 2:
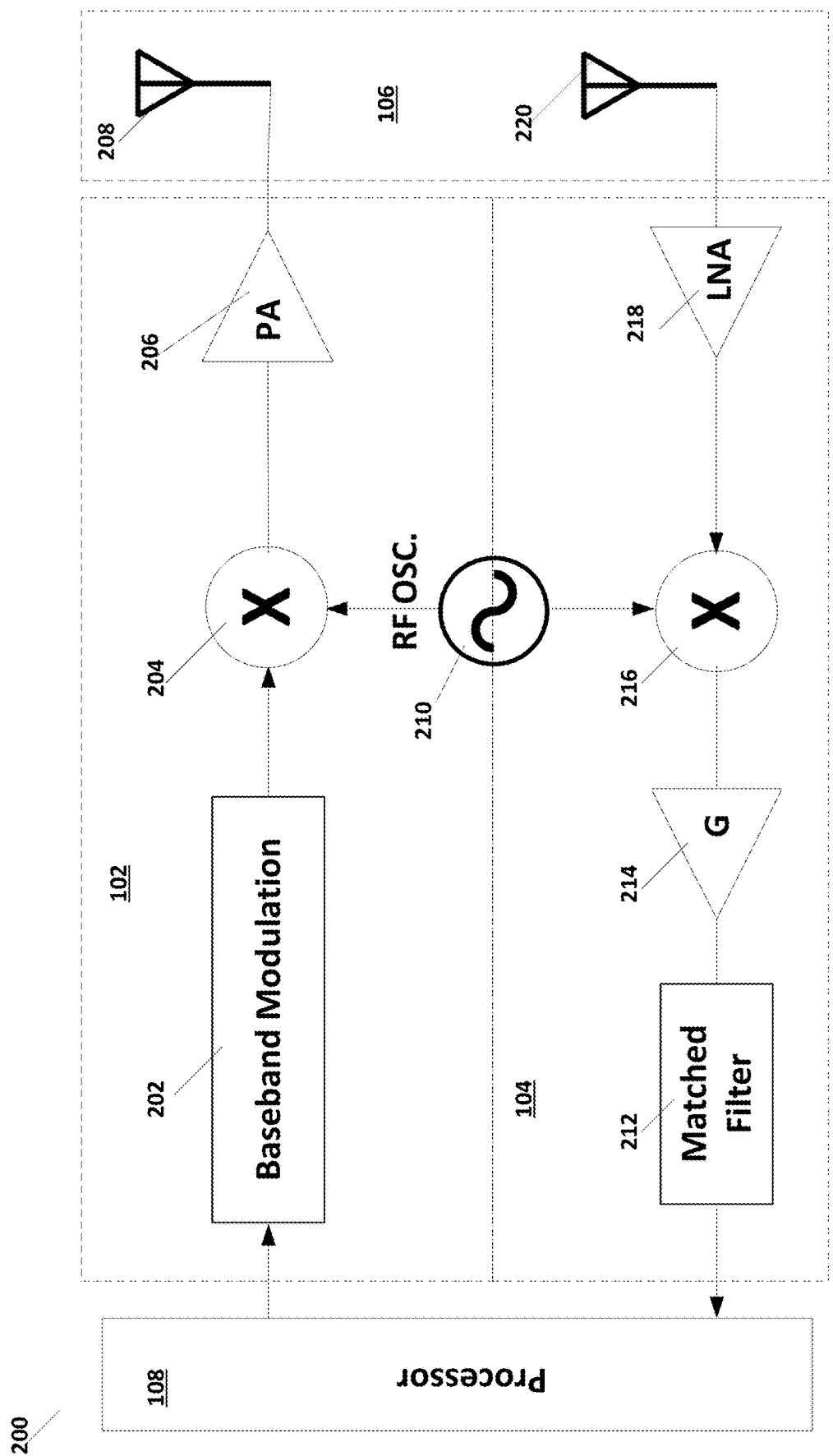
FIG. 2 illustrates a pulsed Doppler radar system as illustrated in FIG. 1A in more detail.

FIG. 2 illustrates a typical pulsed-wave radar system 200, which may be system 100 as illustrated in FIG. 1A. As is illustrated in FIG. 2, transmitter 102 includes a baseband modulation 202 coupled to provide a signal to an upconverter mixer 204. Mixer 204 upconverts to the carrier frequency determined by RF oscillator 210. Baseband modulation 202 determines the pulse frequency T and the pulse duration T. The RF frequency f is determined by the RF oscillator 210. The output signal from mixer 204 is amplified by RF power amplifier (PA) 206 to drive antenna 208 in antenna array 106 to provide pulsed waveform 110. As illustrated in FIG. 1A, the pulsed waveform 110 is reflected from an object to provide a reflected pulse 112.

On the receive side, the reflected pulse 112 is received by receive antenna 220 of antenna array 106 and the signal from receive antenna 220 is input to a low-noise amplifier (LNA) 218. The output signal from LNA 218 is input to a mixer 216, where it is mixed with the RF signal from RF oscillator 210 to down-convert the signal to baseband or near baseband. The signal from down-conversion mixer 216 is then input to an amplifier 214 with gain G. Finally, the signal from amplifier 214 is input to a matched filter 212. The output signal from matched filter 212 is provided to processor 108, which is also coupled to control baseband modulation 202.

As is illustrated in FIG. 2, a baseband pulse envelope is generated in baseband modulation 202 and applied to an intermediate frequency (IF) port of upconverter mixer 204. The RF signal is generated using a stable RF oscillator 210 and is applied to the RF port of upconverter mixer 204. The resulting upconverted signal occupies a bandwidth, β, of approximately $$\beta \approx 1/\tau$$

where τ is the pulse-width of the envelope. The precise bandwidth will depend on the shape of the baseband envelope. It is common to illustrate the baseband envelope as a series of rectangular pulses, but the envelope shape can be selected to suit the radar requirements. If the pulsed transmitted signal is reflected by a moving target, then the reflected signal is Doppler shifted. In other words, reflected pulse 112 will be doppler shifted in comparison with pulsed signal 110.

As was further discussed above, the reflected pulsed signal 112 can be detected by receiver 104, and the velocity of the target 114 with respect to radar system 200 is determined based on the Doppler shift. In some examples, receiver 104 may employ a range gate in the RF front-end. Range gating allows the radar user to select a single target range to observe. When open, the range gate allows normal signal detection. When closed, the range gate attenuates the received signal so that it is not detectable. As discussed further below, Embodiments of the present invention provided for a sliding window to avoid various issues with the conventional gated approach.

As discussed above, a phase shift of radar pulse 110 occurs in reflected signal 112 over a distance, 2R, where R is the one-way range to a target. If the range, R, is changing linearly with time, then there exists a rate of change of the phase of the returning echo. A rate of change of phase is equivalent to a shift in frequency of the returned pulse, and is known as the Doppler shift frequency. The Doppler frequency Fd can be defined as:

$$Fd = V\_r/\lambda$$

where Vr is the target velocity in m/s at distance R and λ is the wavelength of the carrier signal. For a 7.6 GHz carrier frequency f and a velocity equivalent to a human walking pace of 0.2 m/s, this equates to a Doppler frequency of 10.15 Hz. From this, the wanted signal bandwidth of receiver 104 operates from DC to approximately 10 Hz.

The wide bandwidth requirements for short-range pulse Doppler radar make the Ultra Wide Band (UWB) spectrum appealing to this type of architecture. Based on the FCC's definition, UWB systems have at least a 20% 10-dB fractional bandwidth or a 500 MHz 10-dB bandwidth. The bandwidth can be used instantaneously or frequency hopping can be employed as is described, for example, in J. D. Taylor, ed., "Ultra-Wideband Radar Technology, CRC Press, 2001, 40, 44. Systems that employ instantaneous UWB bandwidths typically use short pulses on the order of a nanosecond. This is directly related to the Fourier relationship between the time and frequency domains where a narrow time-domain pulse corresponds to a wide frequency-domain spectrum and vice-versa. Accordingly, some embodiments of the present invention employ UWB technology to provide for a sufficient bandwidth.

Figure 3:
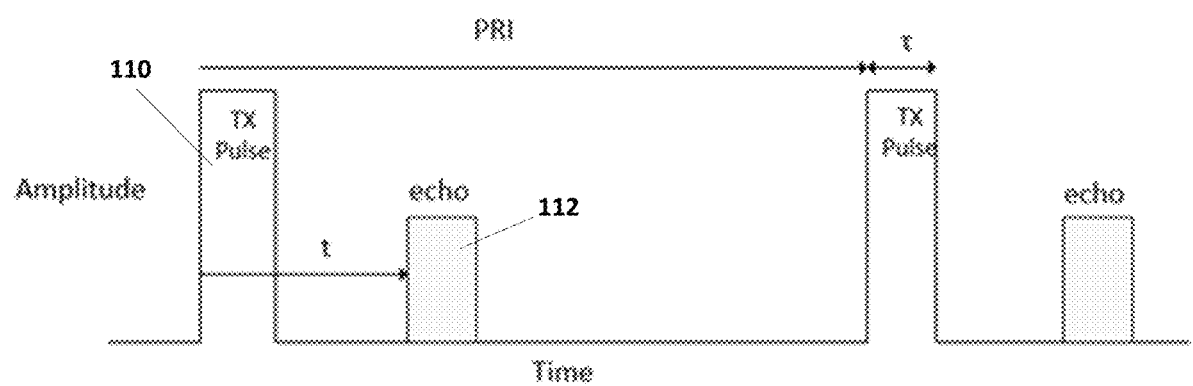
FIG. 3 illustrates the relationship between a TX pulse and a reflected echo pulse in operation of a pulsed Doppler radar system.

FIG. 3 further illustrates the radar pulse 110 and the reflected pulse 112. This figure shows two transmitted pulses of duration τ, separated by the interval PRI T. As discussed above, upon hitting target 114 the transmit pulse 110 is reflected and an echo, the reflected pulse 112, returns to receiver system at a lower amplitude after a time t. The reflection time t is given by $$t=2R/c$$

where c=the speed of light ($3 \times 10^8$ m/s) and R is the range in meters, e.g. the distance between system 200 and target 114. For a distance of 1 ft, the reflection time is t is 2 ns.

Pulsed radar has a minimum range since the echo reflected pulse 112 cannot be received until transmitter 102 is turned off and receiver 104 is turned on. Thus, the minimum time delay resulting in a detectable echo is t=τ. In practice the receiver does not become active until the transmitted power has died down to a safe level and the receiver protection switches are in their low loss state. Conventional radar assumes the time taken for this settling is negligible compared to the pulse width τ. However, for UWB systems, this may not be the case.

UWB transmission is strictly limited by regulation. There are two rules that need to be followed under the regulations. The first rule dictates the maximum mean Power Spectral Density (PSD), i.e., the radiated power within a given bandwidth when averaged over 1 ms, that is illustrated as max. mean PSD=−41.3 dBm/MHz=74 nW per MHz.

The second rule imposes a limit on how the strength of a single transmitted pulse. It basically limits the power of the UWB signal to 0 dBm when passing that signal through a filter of a bandwidth of 50 MHz, illustrated as max. peak PSD=0 dBm/50 MHz.

From the first rule, the maximum mean PSD (power per MHz) is 13.500 times less than that required of typical short-range radio devices that adhere to standards such as Bluetooth® or the Zigbee Alliance®, which transmit at 1 mW per MHz. UWB systems overcome this limitation by using a very large bandwidth. Assuming a pulse occupying a bandwidth of 500 MHz, for example, the pulse duration T becomes 2 ns.

The second rule however limits the instantaneous pulse peak power to a value that shall not exceed 0 dBm when passing the signal through a 50 MHz bandwidth filter (i.e., 10% of the energy of the original 500 MHz wide signal). This translates into a full band signal peak power of +20 dBm (which is 22.7 dB lower than when only the first rule is applied). Therefore, to comply with both rules and maximize the transmitted energy per pulse, we can transmit 186 (=10(−22.7/10)) pulses of +20 dBm (500 MHz bandwidth). Therefore, the mean pulse repetition rate T of transmission becomes 1 ms/186 pulses=5.3 µs.

From the UWB requirements, it is seen that the pulse duration is 2 ns and up to +20 dBm of full band signal peak power. For short range radar to avoid completely missing a reflected pulse that is close to the TX antenna, the turn-off of the TX path and subsequent settling of the RX chain needs to be extremely rapid. Attention is often given to the "Blind Zone" caused by this settling time, which is illustrated in FIG. 4.

Figure 4:
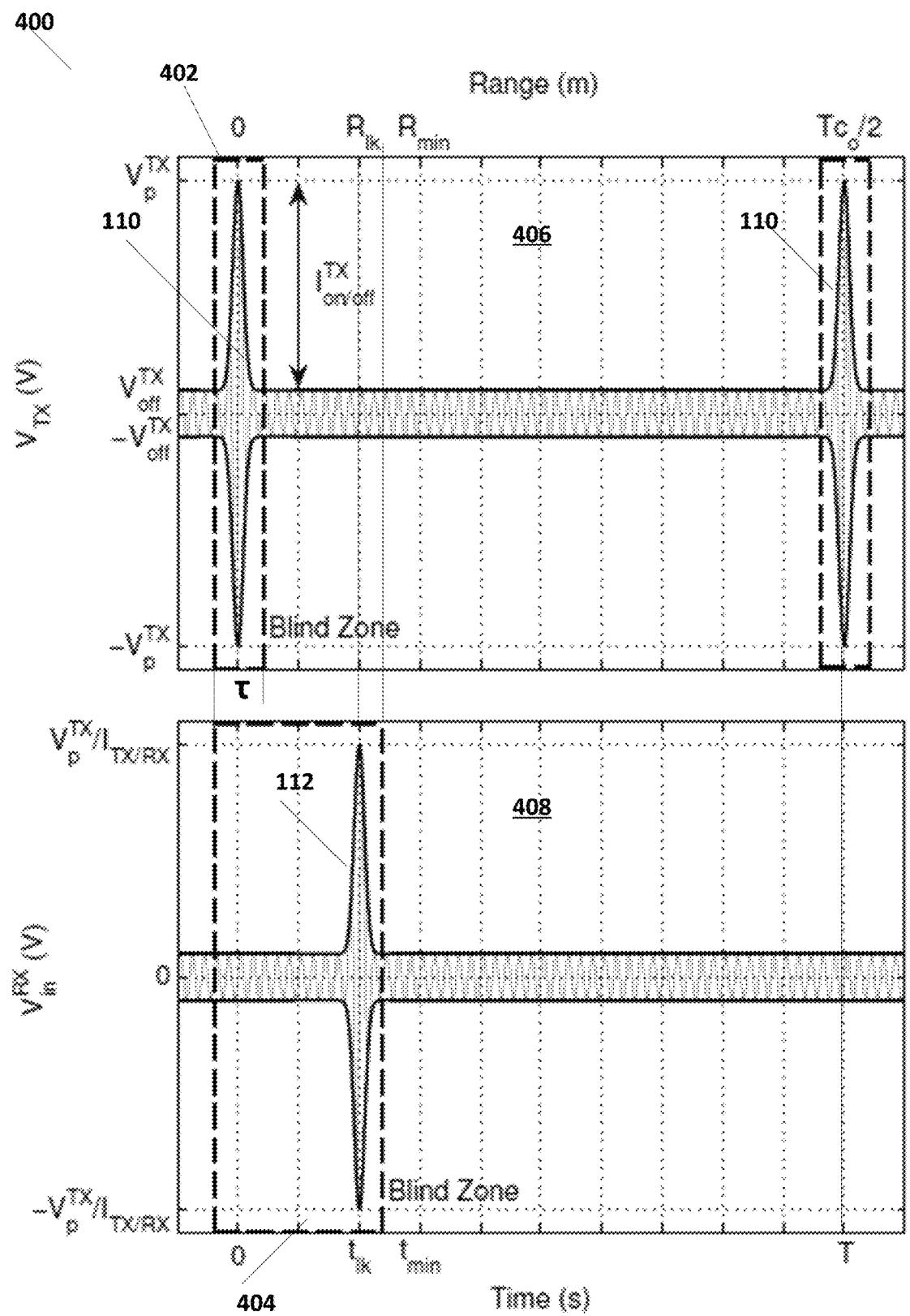
FIG. 4 illustrates the blind zones in a pulsed Doppler radar system.

FIG. 4 illustrates the blind zone timing 400 for detection of an object 114 with pulsed radar. FIG. 4 also illustrates another TX pulse envelope than the square pulse illustrated in FIG. 1B, for example. For a pulsed radar designed for unambiguous range detection, a blind zone exists for short ranges, as indicated by the dashed boxes 402 and 404. As indicated in the transmitter portion timing 406 of FIG. 4, the transmit pulse signal 110 includes pulses separated by the period T. As discussed above, the transmit blind spot given by box 402 is the pulse width T. However, the blind spot as indicated in receiver portion timing 408 is broader, and includes the transmitter shut-off time as well as the receiver turn-on time. As indicated, the minimum range, Rmin, defined by the blind zone box 404 is extended due to finite TX-RX isolation, which results in a leakage signal with a delay, tlk equivalent to the range Rlk. This delayed leakage signal, which is discussed further below, tends to put receiver 104 into saturation, even when isolation is in place. This saturation takes further time to settle as indicated in FIG. 4.

Figure 5:
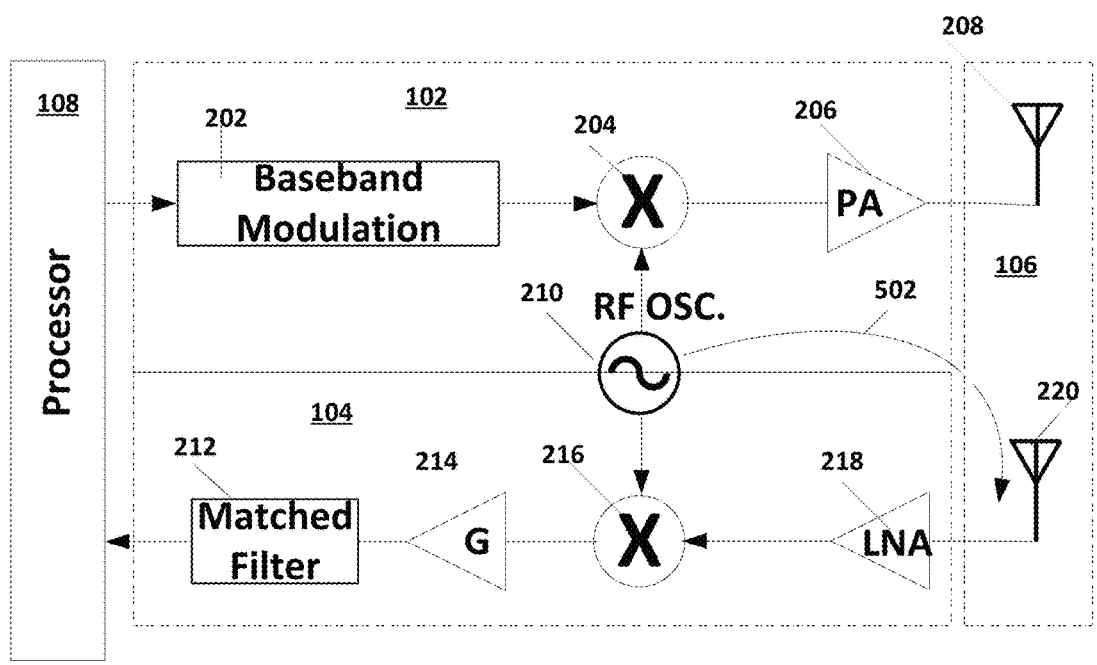
FIG. 5 illustrates an oscillator leakage issue that occurs in pulsed Doppler radar systems as illustrated in FIG. 2.

FIG. 5 further illustrates this timing delay in system 200 as illustrated in FIG. 2. The example illustrated in FIG. 5 is relatively simple. It is a coherent direct conversion transmit receive system 200 that does not include a PLL and no Crystal oscillator. This simplicity lends itself well to low power applications, however it introduces other issues. As is further illustrated in FIG. 5, there is significant leakage from RF oscillator 210 to the received signal at LNA 218. This provides a problem of self-mixing where the local oscillator signal from RF oscillator 210 finds leakage paths and mixes in mixer 216 with itself to produce DC at the output signal of mixer 216. This output is input to amplifier 214 and into matched filter 212. In FIG. 5, this self-mixing is illustrated by leakage path 502 in FIG. 5.

As indicated in FIG. 5, the DC signal output from down-conversion mixer 216 is presented to matched filter 212, which maximizes the signal-to-noise ration (SNR) for a coherent system. For a pulse, matched filter 212 looks like an integrator. This is an unfortunate circumstance as it will continually integrate the DC output signal from mixer 216 while the receiver is "listening" for the reflected pulse 112. This can easily result in a DC level at the output of integrating filter 212 that uses all of the dynamic range of the RX chain in receiver 104, leaving none for the signal itself. Furthermore, to receive pulses from a large distance requires the integrator to be open for a correspondingly longer time, as indicated above. This integrates DC longer and reduces the dynamic range further of receiver 104 even further.

Figure 6:
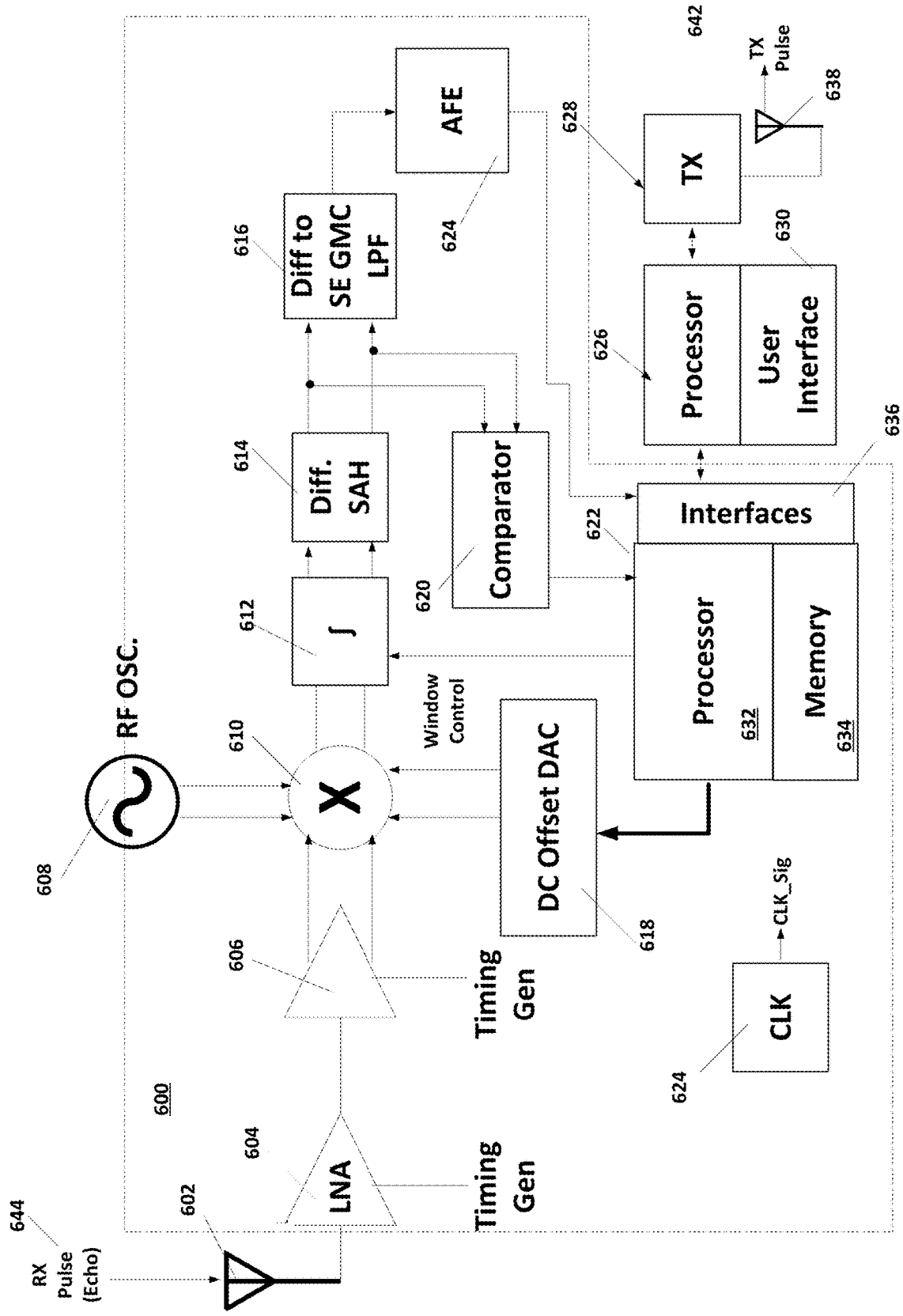
FIG. 6 illustrates a receiver in a pulsed Doppler radar system according to some embodiments of the present invention.

Consequently, according to some embodiments of the present invention, a sliding window in combination with DC offset correction is implemented to compensate for the integrated DC offset. FIG. 6 illustrates a receiver 600 according to some embodiments of the present invention, which illustrates the DC offset and Sliding Window logic according to some embodiments of the present invention. As discussed above, receiver 600 may employ UWB technology. Further, return pulse signals may be processed as discussed above for pulsed Doppler radar systems. As illustrated in FIG. 6, receiver 600 receives a reflected, or echo, pulse 644. Pulse 644 results from reflected a TX pulse 642 transmitted by transmitter 628 from an object, which is not shown in FIG. 6.

As illustrated in FIG. 6, receiver 600 receives an RF input signal from antenna 602 to a low-noise amplifier (LNA) 604. RF input signal reflects the RX pulse, or echo, 644. The output signal from LNA 604 is input to an amplifier 606, which can be an active balun that generates a balanced signal to a mixer 610. Amplifier 606, which is an active balun, can provide further gain to the received RF signal. LNA 604 and amplifier 606 each receive a timing signal that determines when they are active or inactive Mixer 610 receives the signal from amplifier 606 and mixes that signal with the RF signal from the RF oscillator 608 to provide an intermediate frequency (IF) signal, which is essentially at baseband. Down conversion mixer 610 also receives a DC offset from DC offset digital-to-analog converter (DAC) 618.

The intermediate frequency (IF) or DC output signal from mixer 610 is input to filter 612, which as shown in FIG. 6 as an integrating filter as it operates as an integrator to a pulsed signal. Further, as is illustrated in FIG. 6, filter 612 receives a window control signal that controls the sliding window integration, as is further discussed below. The output signal from filter 612 is input to a differential sample-and-hold (SAH) circuit 614. The output signal from integrating filter 612 is sampled to prepare an SAH_OUT signal, which after a delay is output from SAH 614 as a delayed sample-and-hold signal (SAH_DEL).

The differential output signal SAH_DEL from SAH 614 is input to another filter 616. Filter 616 can be, for example, differential to single output G-mc low-pass filter, which produces a single output signal to analog-front-end (AFE) circuit 624. AFE 624 can include circuitry, for example including analog-to-digital conversion (ADC) for input of digital signals to a controller 622 for further processing to determine the distance and the velocity of the target 114. In some embodiments, the signal from AFE 624 may be directly coupled to processor 626.

The differential output signal SAH_DEL from Diff. SAH 614 is also input to comparator 620. Comparator 620 compares the signal with reference signals to determine an output signal that is input to controller 622. In some embodiments, comparator 620 can provide a binary signal that indicates whether the signal SAH_DEL is above a zero level or below a zero level. Such an arrangement can mitigate risk associated with logic errors in determining the level of the output signal from SAH 614. Controller 622 provides the logic for determining the DC offset and the sliding window timing parameters. In particular, controller 622 can determine the DC offset for each individual window of a number of sliding windows by adjusting the DC offset to DAC 618 to adjust the DC level at the input to integrating filter 612 and observing the output signal of comparator 620. The stored DC offset values can then be input to DAC 618 to provide offsets for mixer 610 for each sliding window during operation. As such, in some embodiments mixer 610 may include an adder coupled to receive the DC offset from DAC 618 after downconversion has occurred.

Controller 622 includes processing circuitry 632 that can include any combination of processors, microprocessors, microcontrollers, ASICs, and other components capable of implementing the procedures as disclosed here and executing the instructions described here. Controller 622 may include volatile and non-volatile memory 634 sufficient to store data and programming instructions to execute on processors of controller 622. Memory 634 also includes registers as described further below, including timing registers that are incremented or decremented to affect the timing discussed below. Controller 622 further includes a device interface 636 for communications with other devices, including processor 626. Device interface 636 can be any interface, for example an I2C interface.

As is illustrated in FIG. 6, controller 622 of receiver 600 can be driven by a clock CLK 624, which provides digital timing. Controller 622 is further coupled to processor 626, which is further coupled to a transmitter 628, which transmits pulsed radar signals through antenna 630 as discussed above. Consequently, processor 626 can signal controller 622 upon transmission of a pulse by transmitter 628. Timing, as discussed further below, is triggered by the transmission of transmission pulse 642 from TX antenna 638 by TX 628 and digitally timed according to the clock signal from CLK 624. The interface between processor 626 and controller 622 can be, for example, an I2C interface. In some embodiments, operating parameters stored in controller 622, for example DC offset values, can be overwritten with I2C register values by processor 626. In some embodiments, processor 626 may include a user interface 630 such that operating parameters can be manually changed by an outside user. User interface 630 can be any combination of user input and output devices, including keyboards, pointers, touchscreens, video displays, audio displays, LED indicators, and other devices.

Receiver 600 can be formed with any specifications for each of the components in receiver 600 that is appropriate to the receiver portion of a pulsed-radar system. The input RF signal can have the characteristics of IIP1 dB=−46 dBm and IIP3 dB=−37 dBm. LNA 604 can be an amplifier with gain G=20 dB and a noise factor (NF) of 7 dB. The amplifier, or active Balun 606, can have gain G=12 dB and NF=15 dB. Mixer 610 can have a gain G=8 dB and NF=20 dB. Consequently, the receiver path from LNA 604 through mixer 610 can include a gain G=40 dB and a noise factor NF=7 dB. The signal gain in filter 612 can be close to 0 (G=0).

As a specific example, consider trying to detect a target that is 100 ft. away from transmitter 628. As discussed above, for each 1 ft of reflection the reflected time is 2 ns. Therefore, the reflected pulse 644 from a 100 ft separated target is expected to return 100 ftx2 ns/ft=200 ns from transmission of TX pulse 642. The integration window could be opened at approximately 195 ns delay from the TX pulse and left open for 10 ns and the reflected pulse would be captured. Now assume that the target could be anywhere between Rmin and 100 ft. This would require the integration window to be opened immediately after the TX pulse 642 and remain open until 200 ns+2 ns=202 ns. This wide integration window would likely introduce voltage limiting due to DC offset integration in filter 612 and receiver 600 would saturate well before the reflected pulse arrives. Consequently, in accordance with embodiments of this invention, controller 622 defines a sliding window that includes a window of a defined width that slides across the range. The sliding is achieved by delaying the position of the sliding window every cycle of the TX pulse 642, PRI (T). This effectively reduces the PRF (1/T) by the number of steps used to fully scan the sliding window across the range of detection.

Figure 7:
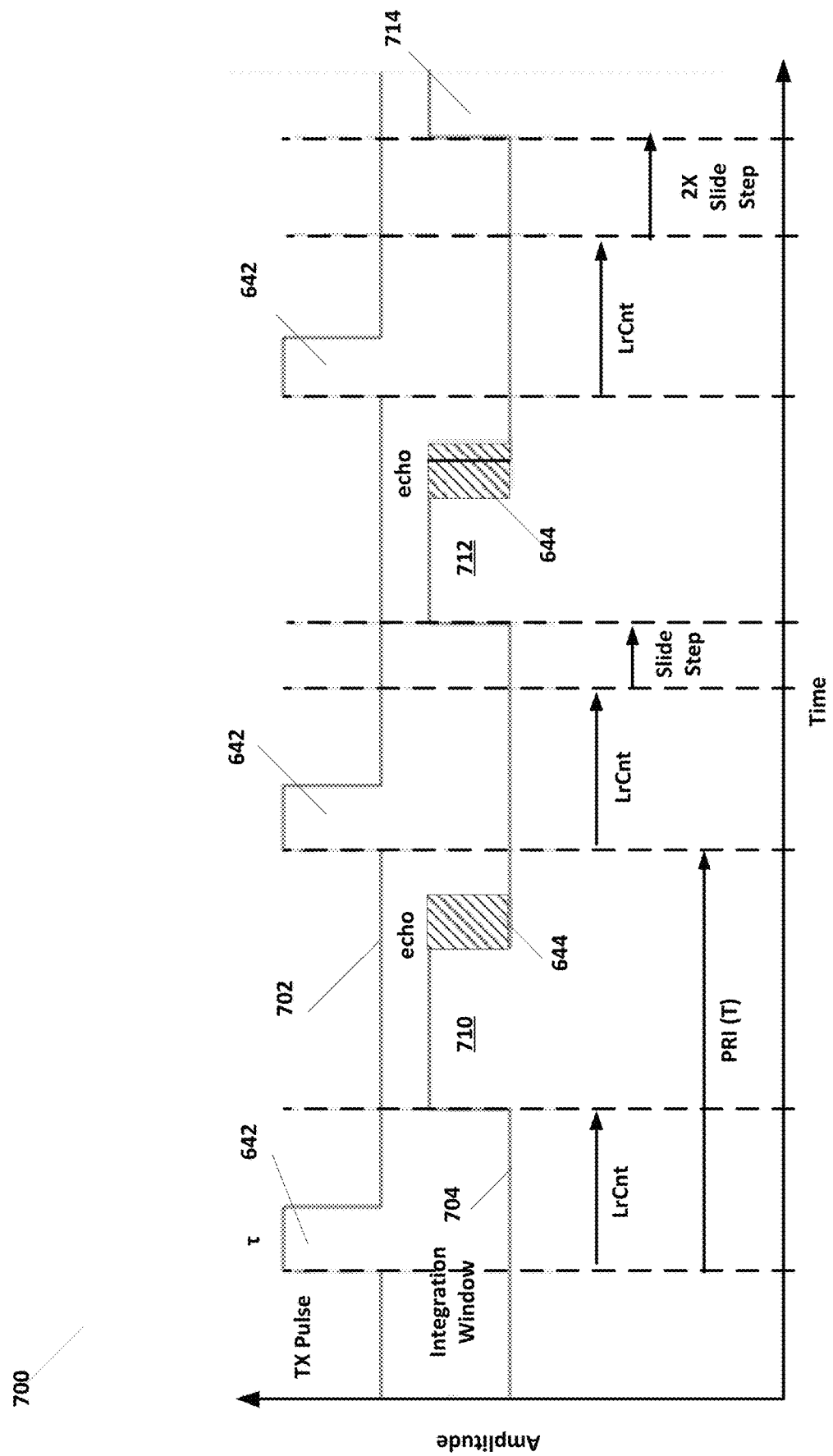
FIG. 7 illustrates a sliding window implementation in the pulsed Doppler radar system illustrated in FIG. 6.

This process is illustrated in FIG. 7. FIG. 7 illustrates timing traces 700 for receiver 600 combined with a corresponding pulsed transmitter. As illustrated in FIG. 7, a first timing trace 702 that illustrates the TX pulses 642 that are transmitted by the pulsed radar transmitter. As is illustrated, the TX pulses 642 are separated in time by PRI (T). As is further illustrated, the pulse width of TX pulses 642 is T. As discussed above, the pulse width T can be, for example, 2 ns.

Second timing trace 704 illustrates the integration window trace overlapped on the trace of the reflected (echo) pulse 644. In most cases, it can be assumed that the target from which the reflected pulse 644 is reflected does not appreciably move within the time frame of the Tx pulses 642. Trace 704 also indicates a series of integration windows 710, 712, and 714. The first window 710 is separated from TX pulse 642 by a time LrCnt. As is illustrated, integration window 710 does not overlap in time with reflected pulse 644. Second integration window 712 follows TX pulse 642, but is separated in time from TX pulse 642 by the time LrCnt+slide_step, which is later than the timing on window 710. As is illustrated in FIG. 7, integration window 712 only partially overlaps with reflected pulse 644. Similarly, the next integration window, window 714, is separated in time from TX pulse 642 by a time LrCnt+2*slide_step. At this time, although not illustrated, timing window 714 overlaps the reflected pulse 644.

As is illustrated in FIG. 7, the transmit pulse 642 is transmitted at regular intervals dictated by the PRI (T). A reflected pulse (echo) 644 appears at the input of receiver 600 at a time dictated by the distance of the target from the transmitter and receiver antennas. As indicated above, this distance is assumed constant or changing very little within a PRI. After a time of LrCnt, the integration window 710 is opened and a search for the echo reflected pulse 644 commences. As seen in FIG. 7, integration window 710 closes before reflected pulse 644 appears and as a result the target return pulse is missed for that PRI.

The next PRI has a SlideStep increment and adds to the delay from the positive edge of the TX pulse 642 to the integration window opening. Within this PRI the leading edge of the echo is captured in the integration window and the trailing edge is missed. The next PRI will capture the echo fully, with a delay of LrCnt+2*SlideStep from the leading edge of TX pulse 642.

Figure 8:
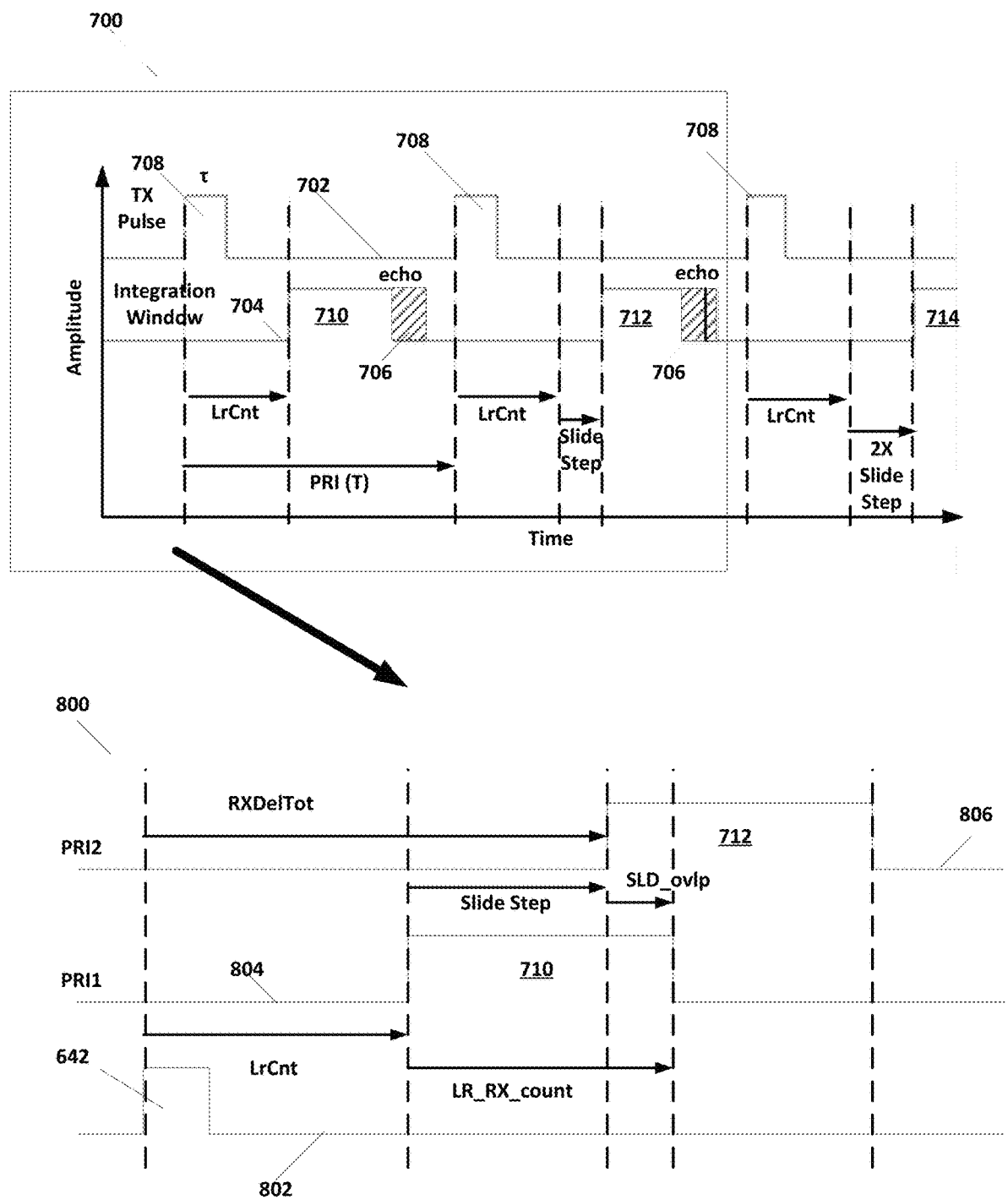
FIG. 8 further illustrates a sliding window implementation in the pulsed Doppler radar system illustrated in FIG. 6.

Once the integrator window opens, a transient condition is created. This transient state takes some time to settle within the RX chain of receiver 600. To accommodate this settling time, an overlap of the sliding window positions is implemented. This overlap is illustrated in FIG. 8. FIG. 8 illustrates a trace diagram 800 that overlaps the integration window 710 with integration window 712. As illustrated in FIG. 8, trace 802 illustrates overlapped TX pulse 642 for two consecutive periods (2 PRIs). Trace 804 illustrates integration window 710 in the first period of TX pulse 642 (PRI1) while trace 806 illustrates integration window 712 in the second period of TX pulse 642 (PRI2).

As illustrated in FIG. 8, integration window 710 opens a time LrCnt after TX pulse 642. The integration window 710 has a width given by LR_RX_count. In time period PRI2, integration window 712 opens at a time given by RXDELTot from TX pulse 642. Integration window 712 also has a width of LR_RX_count. Because 712 is the second sliding window, RXDelTot is given by LrCnt+Slide_Step. The overlap can be implemented with $$SlideStep \leq LR\_RX\_count - SLD\_ovlp$$

where LR_RX_count is the width of the integration window and SLD_ovlp is the amount of overlap the next pulse has over the time of the current pulse. As discussed above, the overlap SLD_ovlp is sufficient to account for settling time in receiver 600.

In a particular example with a time LrCnt at 88 ns, a integration window width LR_RX_count of 52 ns, and an overlap SLD_ovlp of 12 ns, then $$SlideStep \leq 52\ ns - 12\ ns = 40\ ns.$$

The total delay from the rising edge of the TX pulse 642 to the integration opening of the second integration window 712, RXDelTot, is then given by $$RXDelTot = LrCnt + SlideStep.$$

In some embodiments, the SlideStep can be set so that any number N of sliding windows can be formed within the PRI time of TX pulses 642. In other words, the total delay time for start of a sliding window from the TX pulse 642 can be given by $$RXDelTot = LrCnt + n*Slide\_Step,$$
where $n = 0, 1, \ldots, N-1$.

Consequently, the series starts over every N PRI periods.

In addition to the determining of the sliding integration window on each period of TX pulse 642, embodiments provide a DC correction during each of the N sliding windows. As shown in FIG. 6, controller 622 can calibrate the DC offset from data received in comparator 620 for each integration window timing and provide that calibration to DAC 618.

Within a Pulse Doppler radar implementation as illustrated in FIG. 6, the DC offset present at the output of mixer 610 is a weak function of the delay time RXDelTot. Any DC present at the input of integrator 612 limits the dynamic range of the sense circuitry of receiver 600, which is connected to circuit 624 and not shown in FIG. 6. Embodiments of the present invention provide for a unique DC offset and cancellation to be performed for each sliding window position in the sequence of n=0 to N−1 integration sliding windows. To perform this calibration a synthetic aperture radar (SAR) technique using comparator 620 and DAC 618 can be used to acquire and store N DC offset calibration values for the N sliding window positions. These DC offset values are then used under normal operation with the corresponding sliding window position. The DC offset algorithm and sliding window algorithms are implemented using two state machines as explained in FIG. 9A.

Figure 9A:
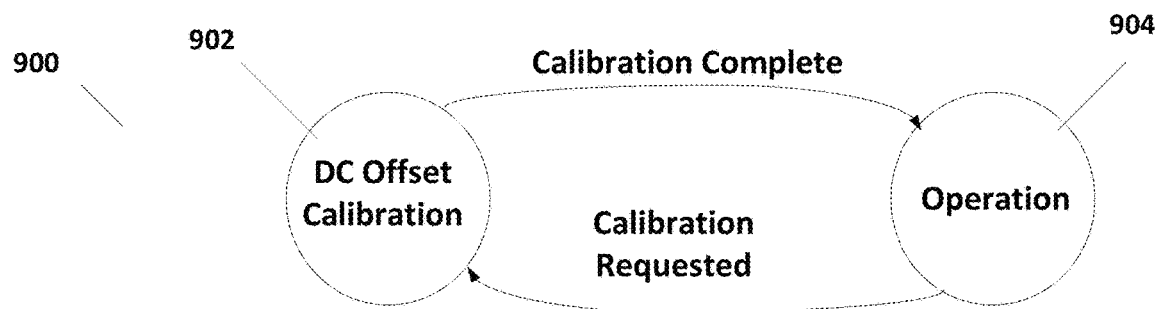
FIGS. 9A, 9B, and 9C illustrate examples of state functions executed by the pulsed Doppler radar system illustrated in FIG. 6.

FIG. 9A illustrates a state function operating on controller 622. Two states are illustrated in FIG. 9A, an operation state 904 and a DC offset calibration state 902. Controller 622 during normal operation is in operation state 904. Calibration state 902 may transition to calibration state 902 upon initial startup or when requested, for example by processor 626. During calibration state 902, the DC offset for each of the N integration windows discussed above are determined.

Figure 9B:
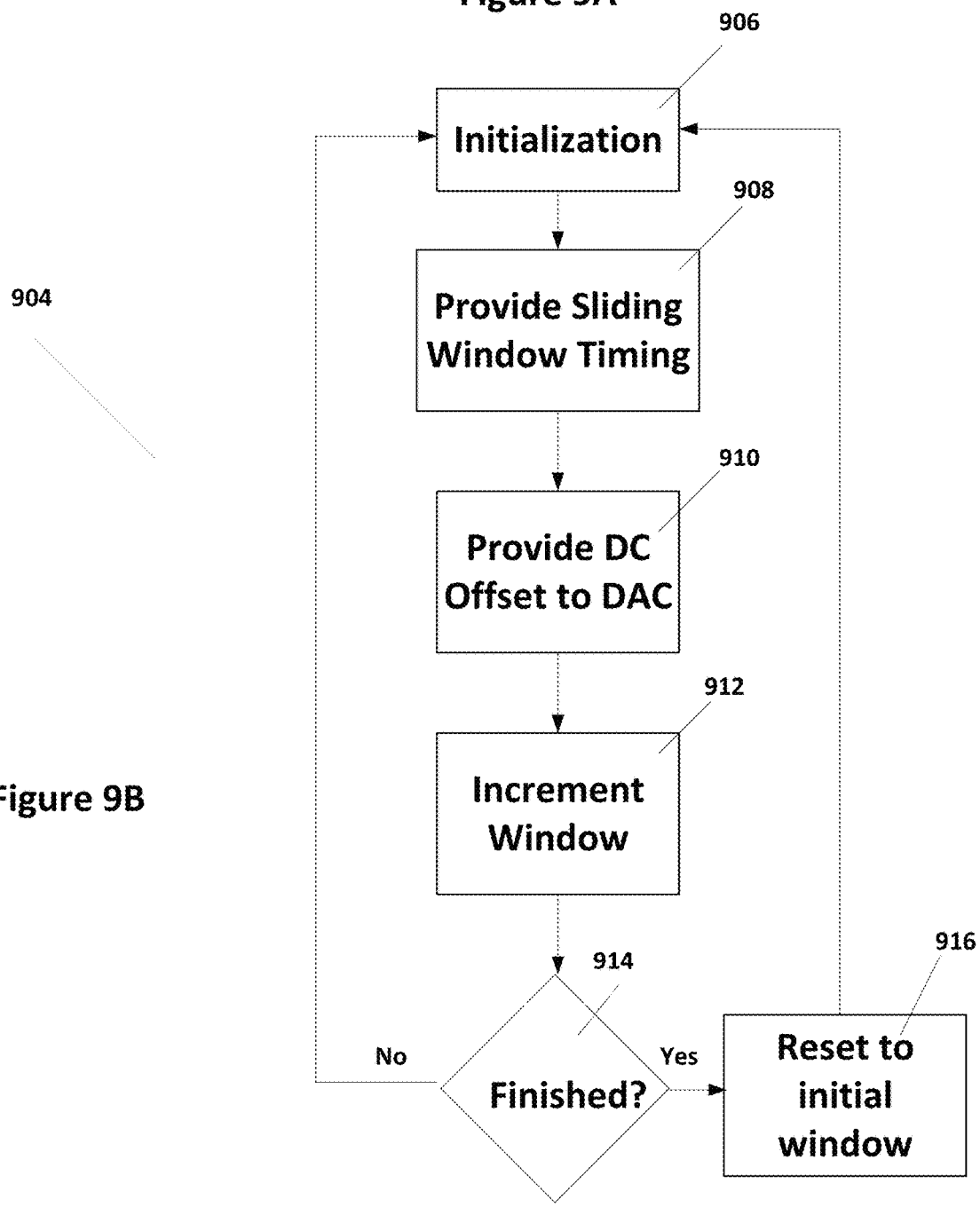
Figure 9C:
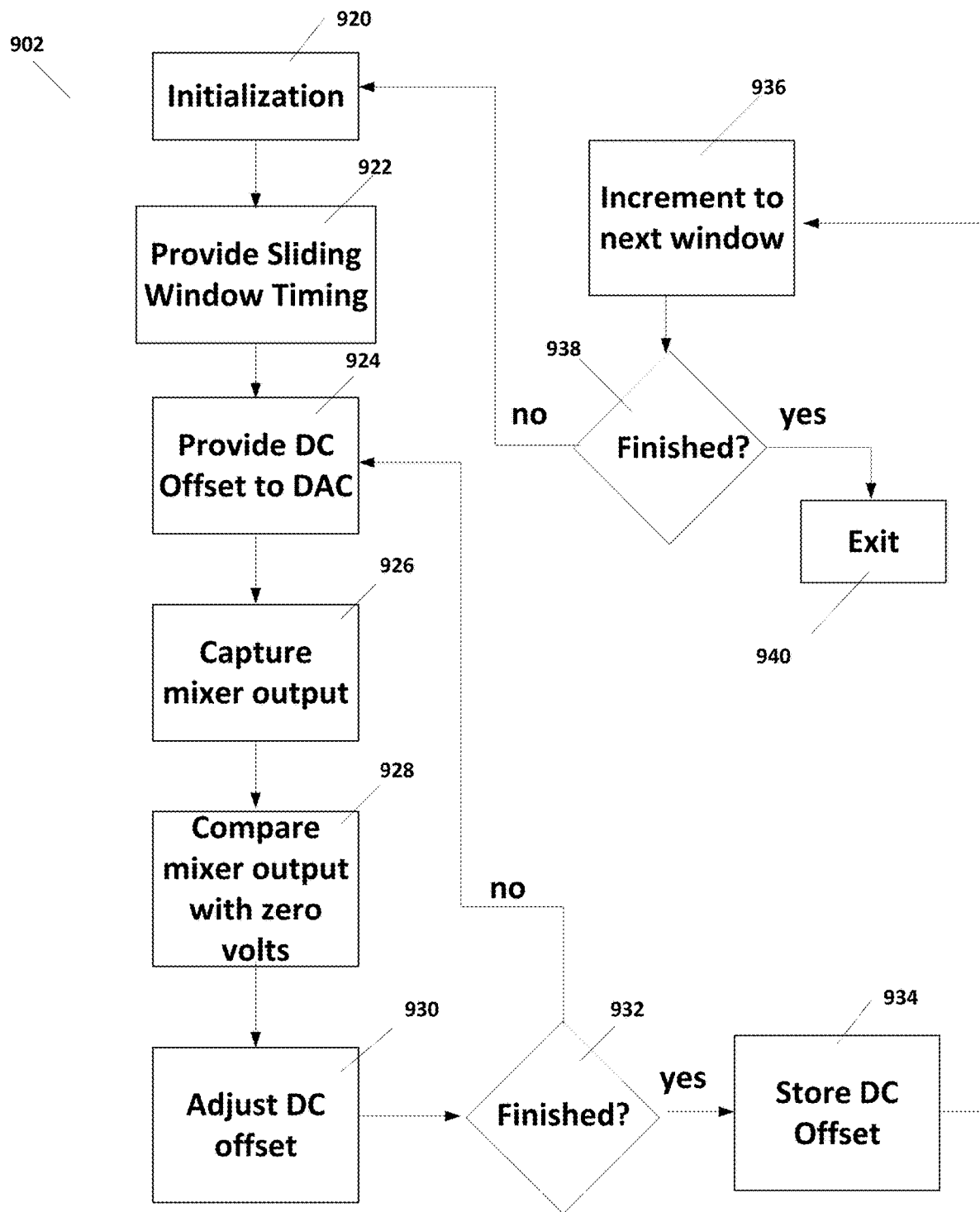

FIGS. 9B and 9C illustrates individual diagrams for each of operation state 904 and calibration state 902, respectively. As has been discussed previously, each of the diagrams are clocked from the TX pulse PRF (1/T) so that each iteration of operation state 904 or calibration state 902 occurs within a clock cycle T. Timing counters are clocked with the clock signal from CLK 624.

FIG. 9B illustrates a flow chart for operation state 904. In operation state 904, each of the N integration windows is associated with a particular stored DC offset value. These DC offset values, along with timing signals for the current integration windows, are provided to DAC 618 and integrating filter 612 to correct for DC offset at mixer 610 for each integration window.

As indicated FIG. 9B, in initiation 906 the timing signals and the DC offset for the currently active integration window are set. As discussed above, for each of the N integration windows, the start time of the integration window is given by LrCnt+n*slide_step and the stop time of the integration window is given by LrCnt+n*slide_step+LR_RX_count, where LrCnt is the minimum time after transmission of the TX pulse, n identifies the individual integration window and runs from n=0 to n=N−1, and LR_RX_count defines the width of the integration window. Consequently, the timing for the integration window and the DC offset values used during that integration window are indexed to the index n.

In step 908, the start and stop timing signals are provided and appropriate signals provided to integration filter 612 to open and close the integration window at the appropriate timing. In some embodiments, timing is controlled by controller 622 so that an on/off signal provided by controller 622 is provided to open and close the integration window in filter 614.

In step 910, controller 622 provides DAC 618 with the digital DC offset value associated with the current integration window. The DC offset provided to DAC 618 in step 910 and the timing signals provided in step 908 are implemented at the time of the TX pulse such that on each TX pulse the index is incremented and a new integration window and associated DC offset is implemented. The DC offset values can be those that are determined during the calibration state 902. However, in some embodiments, a set of registers in memory 634 can be loaded with override values through interface 636 and can be used to replace the stored calibrated DC offset values derived from calibration state 902. Consequently, when an override enable is provided in step 910, the override DC offset values stored in the override registers of memory 634 are used as DC offset values instead of the calibrated DC offset values. This is further discussed below with respect to FIGS. 12A and 12B.

In step 912, the current integration window is incremented (n=n+1) so that on the next TX pulse 642 the new integration window becomes the current integration window and is implemented. In step 914, controller 622 checks to see if all of the integration windows have been implemented (i.e. n=N). If all of the integration windows have been implemented, in step 916 the parameters are reset to the first integration window (n=0), and the cycle is repeated. From step 916, controller 622 returns to initialization 906. In step 914, if not finished then controller 622 proceeds directly to initialization 906. Again, in initialization 906, the DC offset parameters and the timing parameters are set for the current integration window.

In some embodiments, if a target is identified from the signal at circuit 624, processor 626 may provide a signal to controller 622 that locks the integration window to a particular one for better tracking the target. In that case, in operation state 904, the value of n will be fixed for each cycle or until the range to the target moves out of detectability with the integration window.

As discussed above, in operation state 904, receiver 600 cycles through a series of N integration windows that are timed from the transmission of TX pulse 642. Consequently, after N successive TX pulses 642, the receiver once again starts with the initial integration window. As discussed above, the initial integration window opens at a time LrCnt from the leading edge of TX pulse 642 and closes after a width time LR_RX_count, both of which are timed according to the clock signal from CLK 624.

FIG. 9C illustrates operation during calibration state 902. As indicated in FIG. 9A, calibration state 902 is entered when directed to do so by processor 626. This may occur upon start-up or may be requested during operation. During calibration in calibration state 902, no target should be present. In that way, the DC value at the input of integrating filter 612 is only due to systemic offsets.

Calibration state 902 begins in initialization 920. On the initial instance of initialization 920, parameters for the first integration window is set (n=0). Parameters for the remaining integration windows (n=1 through N−1) are set according to the integration window. The parameters that are initialized include the sliding window timing parameters as well as the initiated DC offset parameters. In some embodiments, the DC offset parameters may be initialized to 0. In some embodiments, the DC offset parameters may start with the currently stored values. In each iteration, the timing signals are set as described above (e.g., start time=LrCnt+ n*slide_step and stop time=LrCnt+n*slide_step+LR_ RX_count).

In step 922, integration filter 612 is provided with signals from controller 622 to open and close the current integration window according to the timing signals are set so that the current integration window is opened at the start time and closed at the stop time according to the start time and stop time as discussed above.

In step 924, the current value of the DC offset (DC_offset [n]) is provided to DAC 618. As illustrated in FIG. 6, the analog DC offset associated with the DC offset value is then presented to mixer 610 to be used to offset the input signal to integrating filter 612.

As illustrated in the example of receiver 600 illustrated in FIG. 6, steps 926 and 928 are executed by SAH 614 and comparator 620, respectively, instead of controller 622. In step 926, the output signal from integrating filter input to sample-and-hold circuit SAH 614 is captured and held. In some embodiments, SAH 614 operates according to the clock signal from CLK 624. The output signal from SAH 614 is input to comparator 620, which in some embodiments compares the output signal to zero volts. Consequently, controller 622 receives a digital signal from comparator 620 that indicates whether the signal from SAH 614 is above or below the zero level.

In step 930, controller 622 adjusts the DC offset DC_offset[n] for the current integration window depending on whether the comparator signal from comparator 620 indicates a negative or positive DC value at SAH 614. For example, if the comparator signal indicates a positive value, the DC offset can be decreased by an adjustment value. If the comparator signal indicates a negative value, the DC offset can be increased by an adjustment value. Adjustments occur on each iteration until the comparator signal switches (i.e. from SAH output value being positive to negative or negative to positive). In some embodiments, adjustment values can be adjusted during operation so that the DC offset value can converge to an optimum value quicker. In other words, in the initial loops, the adjustment value may larger than those values that are used closer to convergence. In some examples, the DC offset values can be adjusted by adjusting individually each bit of the digital DC offset value from most-significant-bit to least-significant-bit.

In step 932, controller 622 determines whether or not the DC offset value has converged. In that situation, the lowest adjustment value is used and the comparator signal has indicated a switch as described above. If a single adjustment value is used, then convergence is determined when the comparator signal switches. If increasingly lowered adjustment values are used, then convergence is determined if the smallest adjustment value is used and the comparator signal switches.

If the iterative loop is not completed as determined in step 932, then controller 622 proceeds to step 924 where the updated DC offset is presented to DAC 618 and a new iteration is begun. If the iterative loop is completed as determined in step 932, the controller 622 moves to step 934 where the DC offset value for the current integration window is stored for later use in operation state 904.

From storage step 934, controller 622 proceeds to step 936 to increment to the next window (n=n+1) and moves to step 938. In step 938, if all N of the integration windows have been calibrated (e.g., n=N−1) then controller 622 moves to exit 940 to transition back to operating state 904.

If not, then controller 622 transitions to initialization 920 to set parameters as described above for the next window.

Consequently, calibration state 902 allows for a determination and storage of a DC offset for each of the N integration windows. Those DC offset values are then used in operation state 904 to provide DC offsets to mixer 610. In some implementations, N can be set to 10.

Figures 10A, 10B:
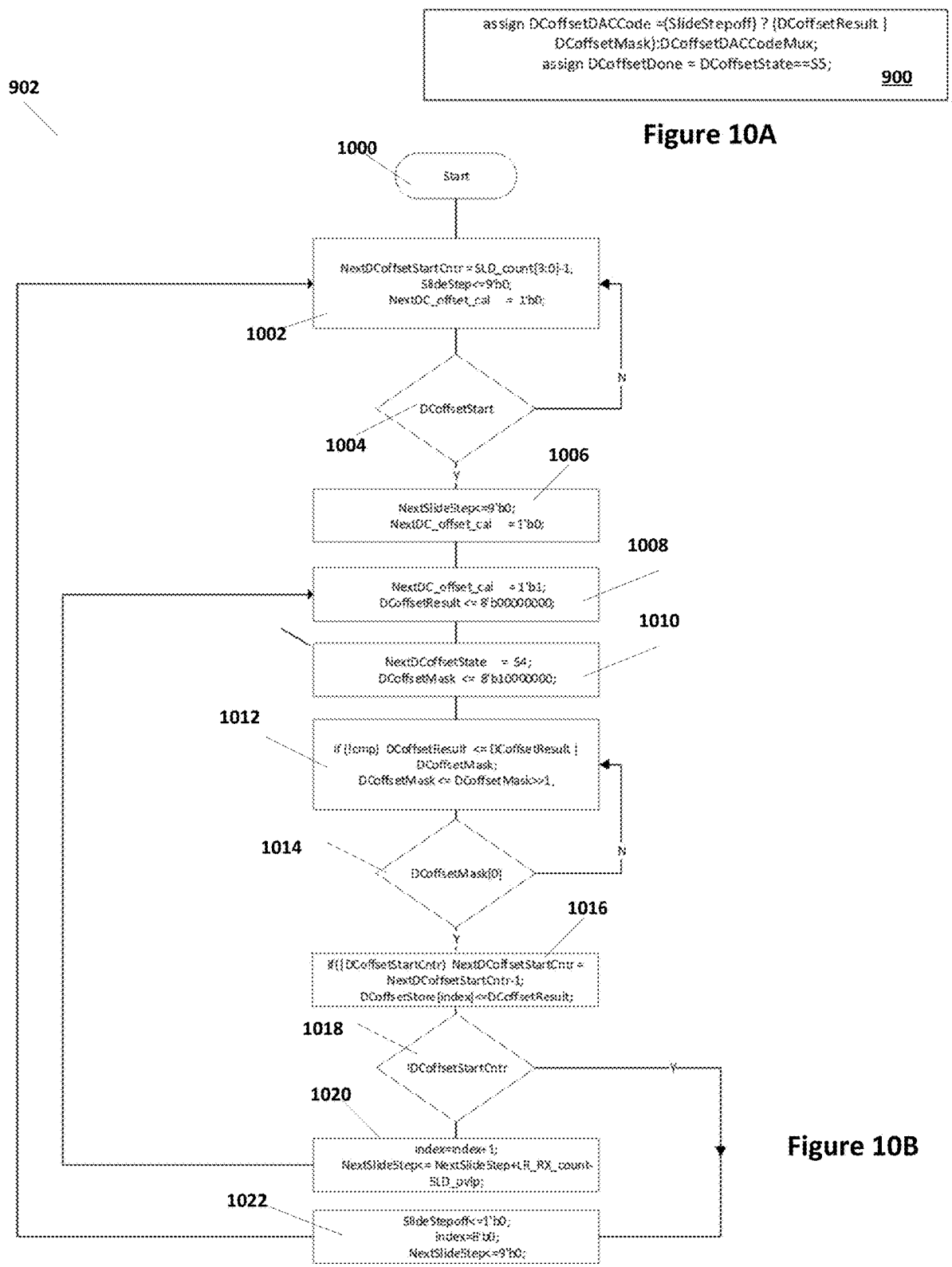
FIGS. 10A, 10B, and 10C illustrate further examples of the state functions illustrated in FIGS. 9B and 9C, respectively.

FIG. 10A provides another depiction of the state function 900 as illustrated in FIG. 9A. As described in state function 900 as illustrated in FIG. 10, either a DC offset calibration or the results of such a calibration are applied to each integration window.

As discussed previously, FIGS. 10B and 10C illustrates individual diagrams for each of calibration state 902 and operation state 904, respectively. As has been discussed previously, each of the diagrams are clocked from the TX pulse PRF (1/T) so that each iteration of operation state 904 or calibration state 902 occurs within a clock cycle T. Timing counters are clocked with the clock signal from CLK 624.

FIG. 10B illustrates another example of calibration state 902. As illustrated in FIG. 10B, calibration state 902 starts at step 1000 and moves to step 1002 to set parameters, including the number of sliding integration windows N, that are used in the system. In step 1004, calibration state 902 of FIG. 10B determines whether an asynchronous trigger had been received from processor 626 as illustrated in FIG. 6. If not, then controller 622 returns to step 1002. This loop continues until state function 900 is transitioned to activate calibration state 902. If the asynchronous signal from processor 626 is received, then controller 622 transitions from step 1004 to step 1006. In step 1006, parameters, or counters, are reset for the current iteration. Also, the initial DC offset result is set. In comparison with the example illustrated in FIG. 9C, steps 1002, 1004, and 1006 may correspond to initialization step 920 and window timing step 922. A synthetic aperture radar (SAR) loop is started in step 1008.

Steps 1008 and 1010 describe parameter set-ups for the loop to initialize parameters for the iterative process of finding the correct DC offset for the current window. Steps 1012 and 1014 illustrated in FIG. 10B correspond to the loop described as steps 924, 926, 927, 930, and 932 in FIG. 9C. In that loop, the DC offset value is adjusted such that the comparison signal switches, indicating that the DC offset value has converged.

Once convergence is determined in step 1014, controller 622 proceeds to step 1016. In step 1016, the results are stored and adjustments are made to avoid wrapping on countdown timers that are used to affect the timing as discussed above. As such, step 1016 corresponds to step 934 of FIG. 9C. Controller 622 then proceeds to step 1018.

In step 1018, controller 622 determines whether calibration is complete (i.e. a calibrated DC offset value for each of the N integration windows has been determined). If the calibration is not complete, then controller 622 proceeds to step 1020 where the sliding window is moved (i.e. n is incremented) and controller 622 returns to step 1008 to start the next iteration. If calibration is complete, the controller 622 proceeds to step 1022 where parameters are set to return to the loop defined by steps 1002 and 1004 until another request for calibration is received.

As is illustrated in FIGS. 9C and 10B, calibration state machine 902 performs several tasks. As discussed above, calibration state machine 902 can be triggered asynchronously from a microcontroller such as processor 626. Calibration state machine 902 then calibrates a DC offset for each of the N sliding window positions. The calibrated DC offset values are stored for each of the sliding window positions. In some embodiments, the stored DC values can be overridden through, for example, an I2C interface with processor 626. In some embodiments, the risk of logic errors can be mitigated by allowing an inversion in comparator 620.

Figure 11A:
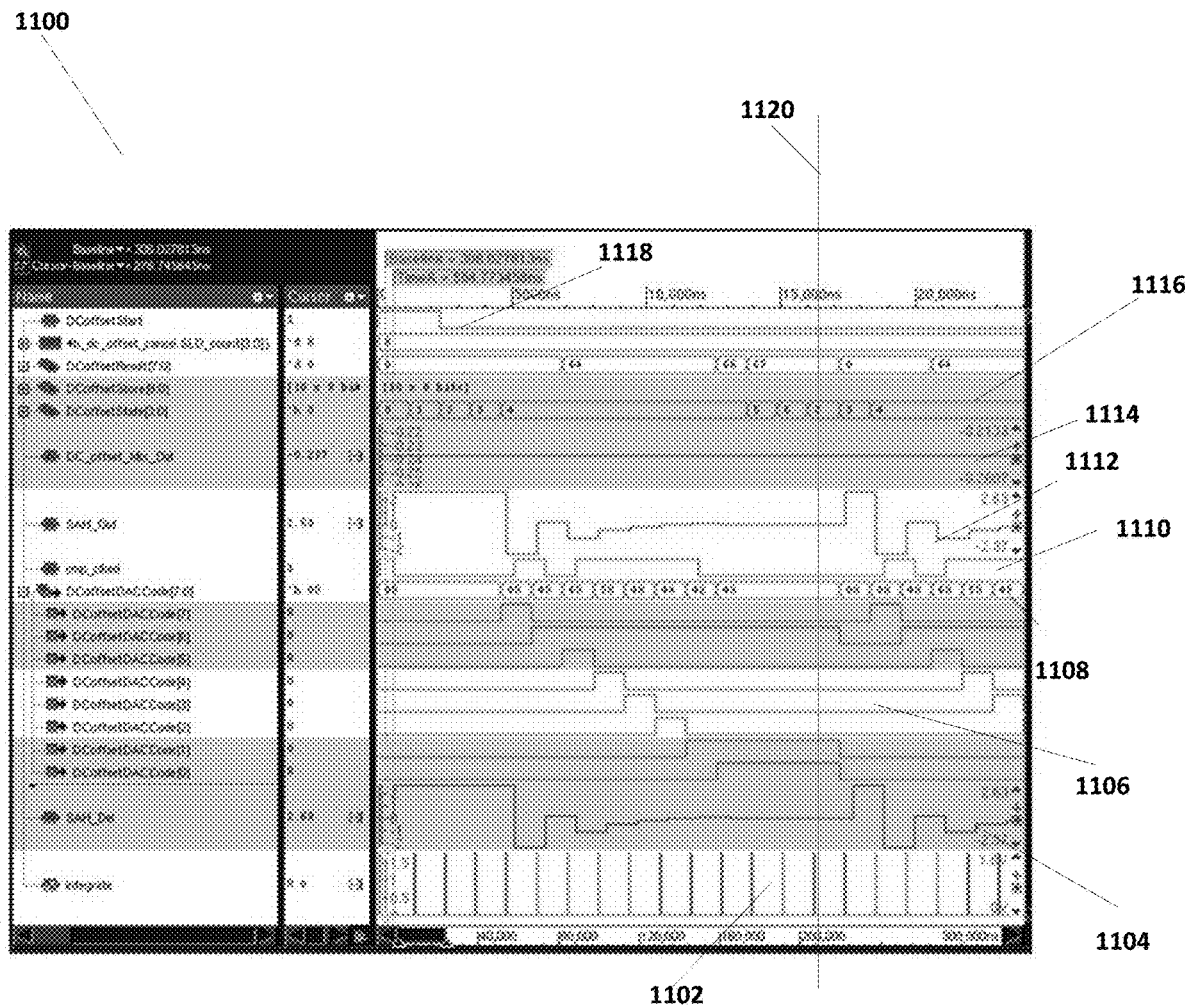
FIGS. 11A, 11B, 11C, and 11D illustrate simulations of a pulsed radar system as illustrated in FIG. 6 executing the calibration state functions illustrates in FIGS. 9C and 10B above.

Aspects of calibration state 902 as further illustrated in FIGS. 9C and 10B are illustrated in FIGS. 11A through 11D. FIG. 11A illustrates a simulation 1100 of the DC offset procedure. The parameters and process illustrated in FIG. 11 are those of calibration state function 902 as illustrated in FIG. 10B. Simulation 1100 include overlay of several traces involved in the DC offset calibration as discussed above. As is illustrated in FIG. 11, the traces include the following: a calibration start signal 1118 (DCoffsetStart); a DC offset result signal 1114 (DCoffsetResult[7:0], DCoffsetStore[9:0], and DC offsetState[3:0]); an uncorrected output from mixer 610 (DC_offset_Mix_Out); an output signal 1112 from SAH 610 (SAH_Out) that includes the DC offset correction, but not the timing delay; a delayed output signal 1104 from SAH 610 (SAH_Del) that reflects the timing delay in processing to the output signal 1112 from SAH 610; the comparator output signal 1110 from comparator 620 (cmp_clked); the individual bits of the DC offset DAC code 1106 presented by controller 622 to DAC 618 (DCoffsetDACCode [7:0], and the integration window 1102 presented to integrating filter 612 by controller 622.

As is illustrated in FIG. 11A and discussed above, an asynchronous calibration start signal 1118 is received from processor 626. As discussed above, start signal 1118, DCoffsetStart, is used in step 1004 to determine whether to start the calibration sequence or not. As discussed above, calibration state function 902 actually begins when start signal 1118 is received.

The uncorrected mixer output signal 1114 (DC_offset_Mix_Out), which is the output from mixer 610 without the DC offset. As a particular example presented in FIG. 11, the mixer output signal 1114 is at −237 mV. This sets the DC offset value that would be needed to offset this DC value.

When integration window 1102 is high, the output signal from integration mixer 612 is input SAH 614. The SAH output signal is shown at trace 1112 and after a short delay this signal appears at the SAH_Del output signal 1104. The SAH_DEL output signal 1104 is input to comparator 620, which provides a binary comparator signal 1110 which indicates whether the SAH_DEL output signal 1104 is above or below zero. DAC code 1106 indicates the binary search that is performed in steps 1012 and 1014 illustrated in FIG. 10B to set the DC offset correction values. As is illustrated in SAH_DEL 1104 and in comparator output trace 1110, the bits of the DC offset DAC code 1106 are adjusted progressively. As is illustrated, comparator 620 measures the DC value from SAH_DEL with respect to 0V and switches. Depending on the comparator value, a mask bit is set in step 1012 to affect the binary search for the DC offset for the current integration window.

With regard to the binary search, as is illustrated in trace 1106 of FIG. 11A, each of the 8 bits of DC_OffsetDACCode is flipped in traces 1106 until the DC offset value has converged as indicated by trace 1110. As is further illustrated in FIG. 11A, the switch from one integration window to the next integration window occurs at time 1120 in simulation 1100. The transition from one integration window to the next integration window occurs in step 1020 of FIG. 10B.

Figure 11B:
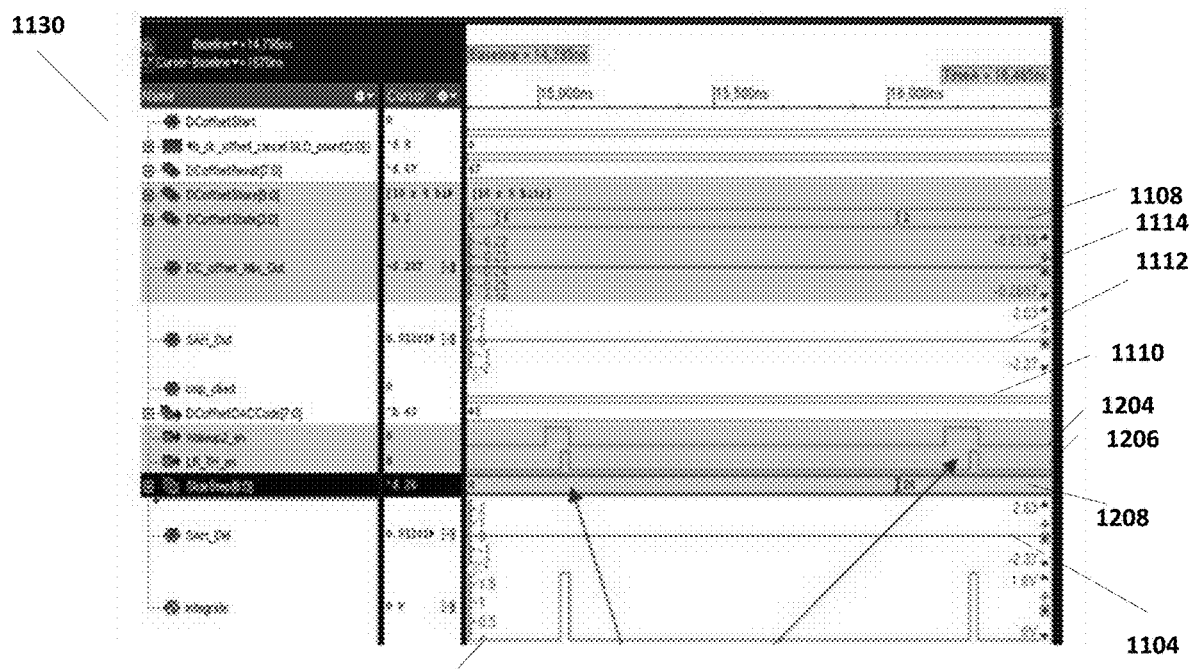
Figure 11C:
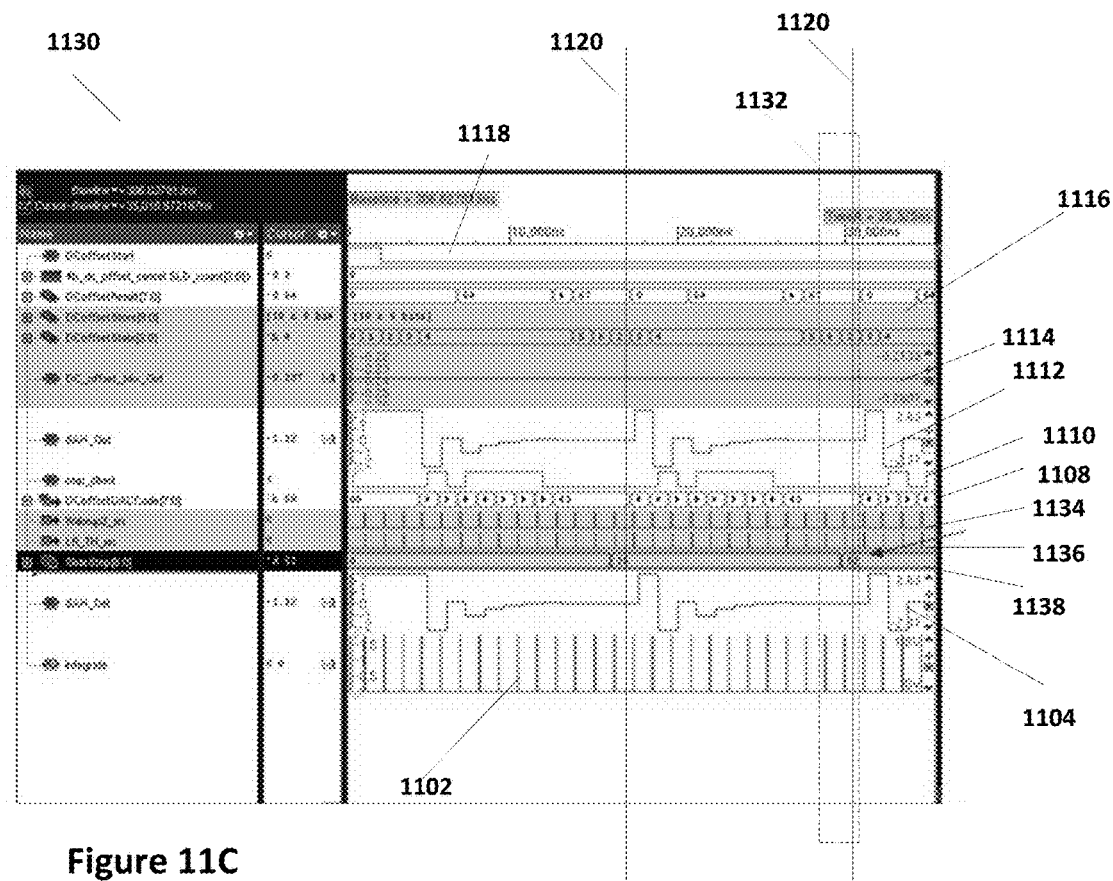
Figure 12A:
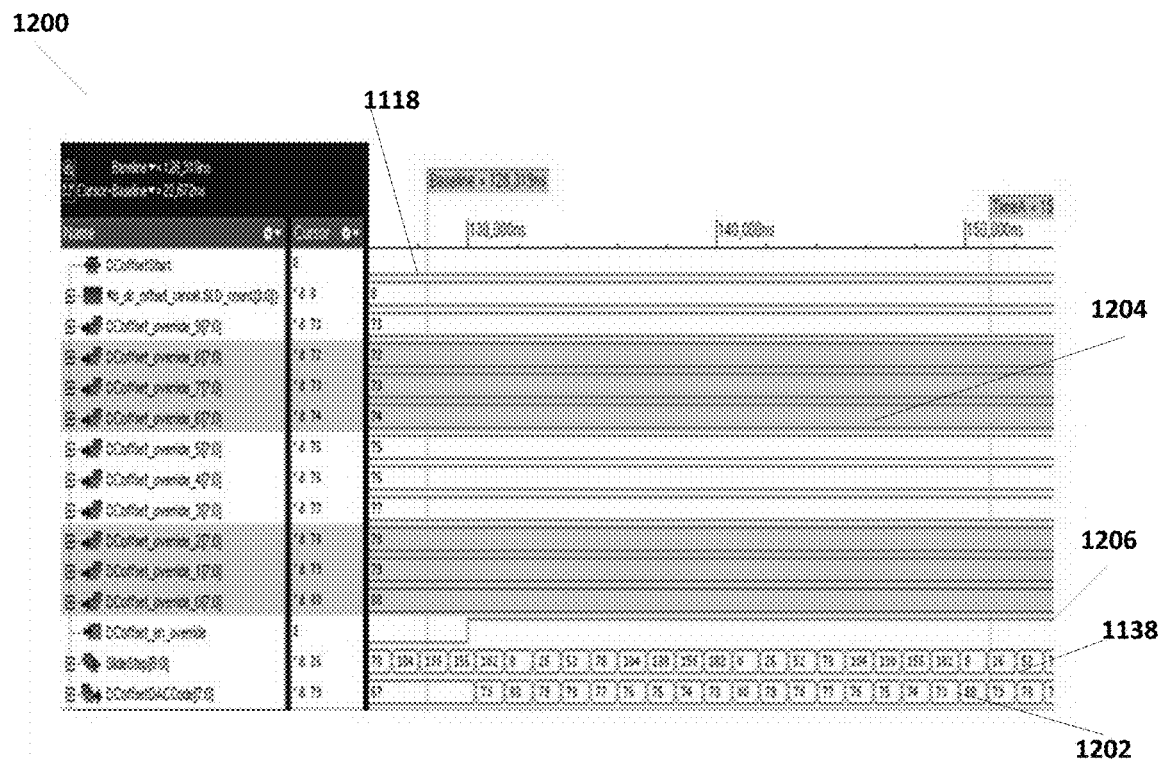
FIGS. 12A and 12B illustrate simulation of a pulsed radar system as illustrated in FIG. 6 executing the operation state function illustrated in FIGS. 9B and 10C above.
Figure 12B:
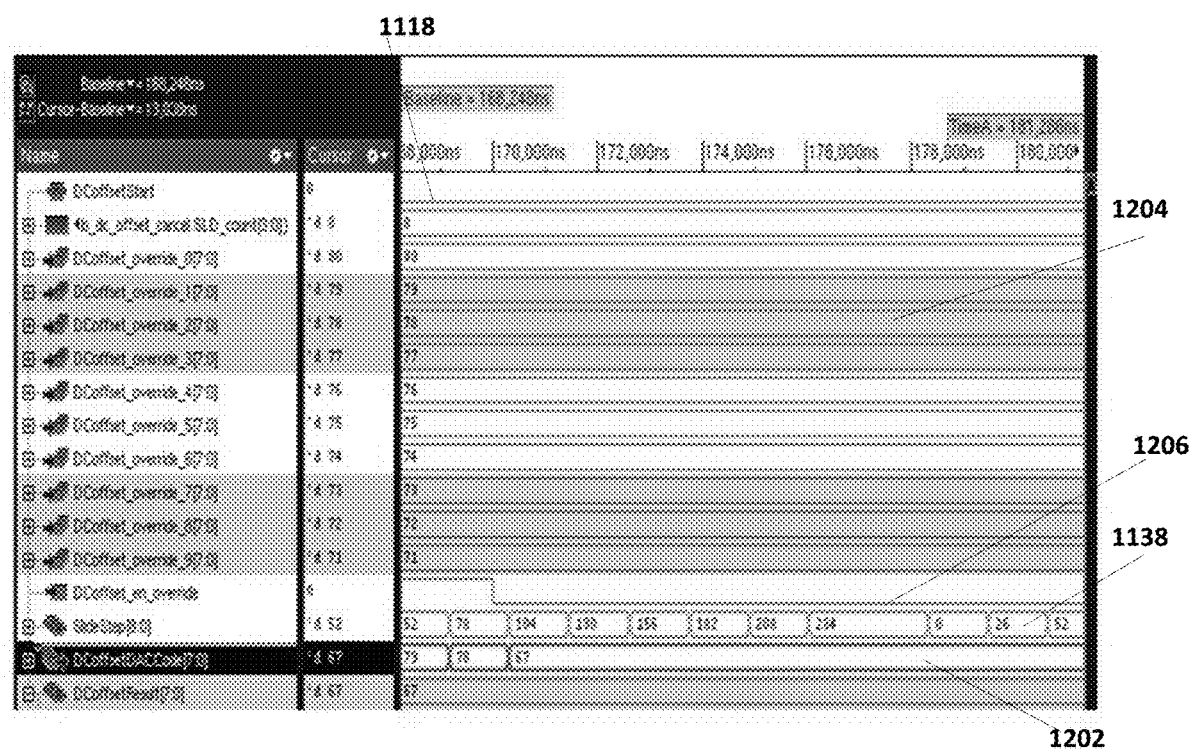

FIGS. 11B and 11C illustrates simulation 1130 that demonstrates transitions between successive integration windows at times 1120 as indicated in FIG. 11C. FIG. 11B illustrates a blow-up of the timing window 1132 indicated in FIG. 12B. FIGS. 12A and 12B further illustrate a wake up enable signal 1134 (Wakeup2_en) and a integration window enable signal 1136 (LR_TH_en) signal that allow transition in the slide-step value 1208 (SlideStep[8:0]). At the end of each DC offset calibration, the integration window is moved in position using the two enable signals and the incrementation in the value of slide step value (which is n*slide_step) as described above.

Figure 11D:
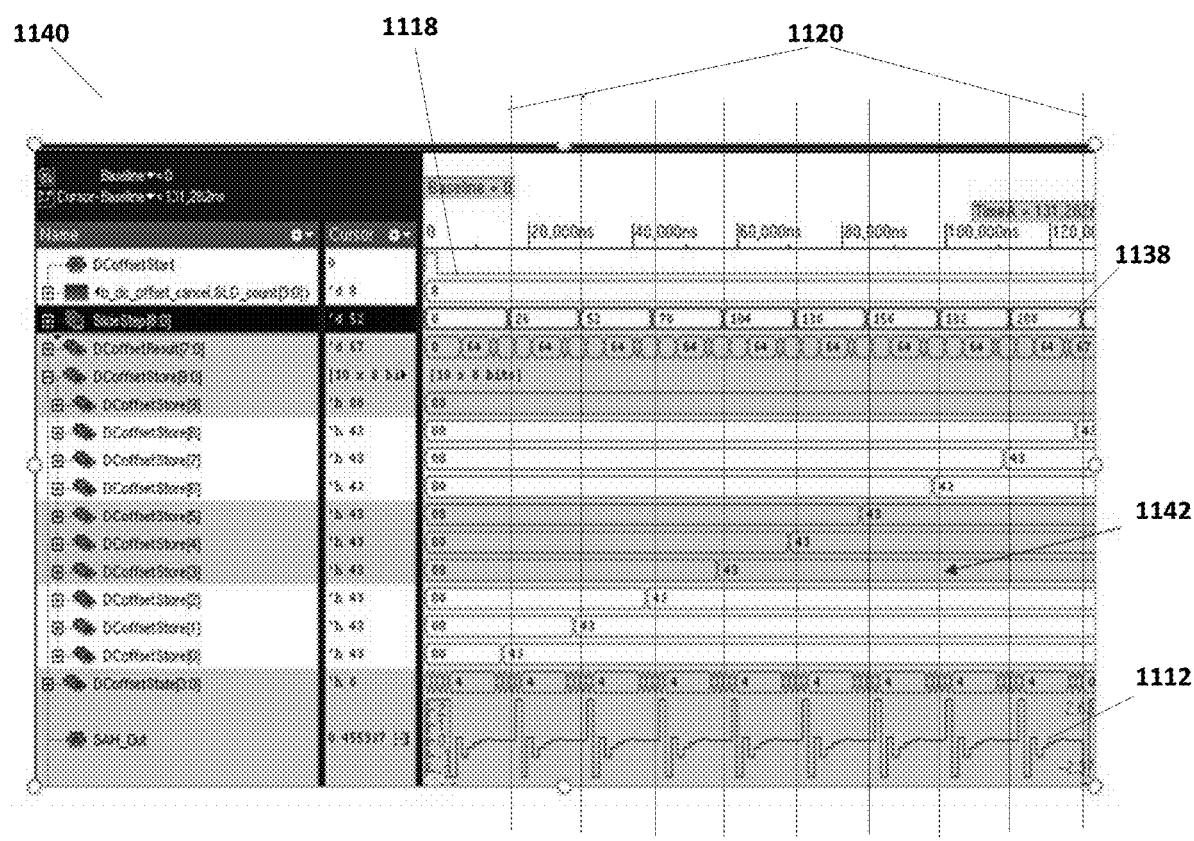

FIG. 11D illustrates storage of DC offset values. As indicated in simulation 1140 as indicated in FIG. 11D, several transitions from one integration window as another. This is indicated in the slide step value trace 1136, indicating the current slide step value=n*slide_step as discussed above. Traces 1142 illustrates storage of one of DC offset values (DCoffsetStore) in each of the integration window periods.

Figure 10C:
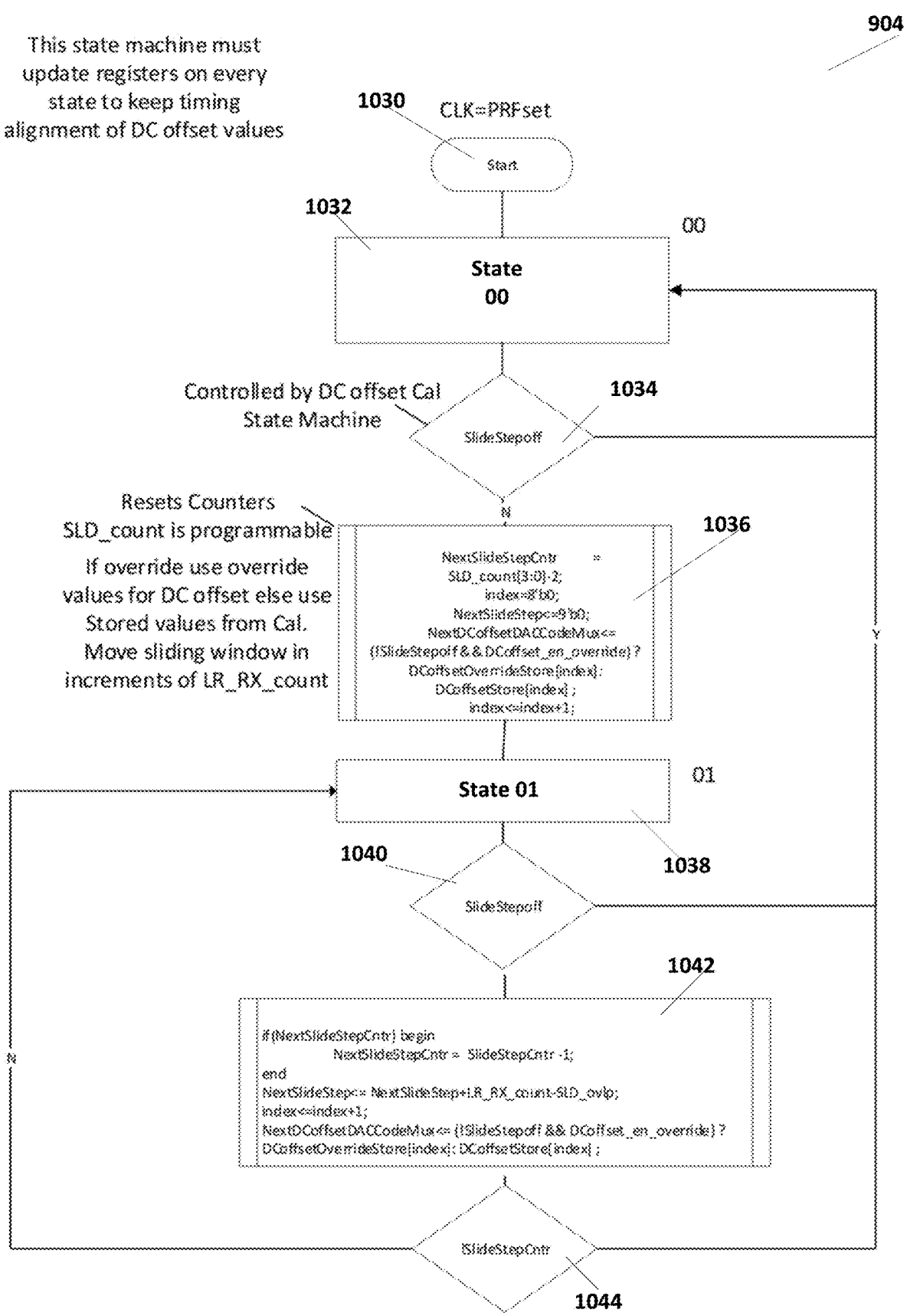

FIG. 10C illustrates another example operation state 904. In operation state 904, registers are updated on every state to keep the timing alignment of DC offset values and integration windows with the TX pulse signal. As illustrated in FIG. 10C, operation state 904 starts in start step 1030, which is transitioned to upon startup. In state 1032, state 00, operation state 904 is in a hold state until a flag SlideStepOff is not asserted. As shown in calibration state 902 as indicated in FIG. 10B, the flag SlideStepOff can be asserted in, for example, step 1006 and deasserted in step 1022 prior to transition out of calibration state 902. Step 1034 determines whether the flag SlideStepoff flag determines whether controller 622 returns to state 1032 or whether it proceeds to step 1036. In step 1036, controller 622 resets counters to initialize transition to operation. As discussed above, in step 1036, parameters such as the integration window index n, if a DC offset override is used a DC offset override enable can be used. From step 1036, controller 622 can transition to state 01. State 1038 defines an operational loop that controls the sliding integration windows and corresponding DC offset values presented to integration filter 612 and DAC 618, respectively. In some embodiments, a SLD_count is programmed. In some embodiments, the slide_step value is looped after several SLD_count.

In step 1040, the flag SlideStepOff is checked again. If it has been reasserted, controller 622 returns to state 00 at step 1032. If not, the controller 622 proceeds to step 1042 where the integration window timing is set and the DC offset value is provided to DAC 618. Controller 622 also sets parameters to proceed to the next integration window. From step 1042, controller 622 proceeds to step 1044 where the flag SlideStepOff is checked again. If the flag has been reasserted, then controller 622 returns to step 1032. If not, the controller 622 proceeds to step 1038.

Operation state 904 performs several tasks. First, operation state 904 slides the integration window by an amount that creates an overlap on the positive edge over every TX pulse. In some embodiments, the integration windows are looped after a number of cycles, for example SLD_counts. Additionally, the sliding window can be controlled by DC offset calibration state 902 or operational state 904.

FIGS. 12A and 12B illustrates a simulation 1200 that uses override registers to replace the stored DC offset values derived in calibration state 902. FIG. 12A illustrates simulation 1200 where stored DC offset override values 1204 (DCoffset_override_[0-9]) instead of the calibrated DC offset values 1142. A DC override flag 1206 is also shown transitioning from a low state to a high state. As illustrate in the illustrated DAC codes 1202 (DCoffsetDACCode), the values used for DC offset are those used rather than the stored calibration DC offset values 1142 as illustrated in FIG. 11D.

As illustrated in the particular example of FIG. 12A, ten override registers 1204 each of 8 bit width are provided. When the override 1206 is enabled, the next TX pulse cycle (PRF cycle) starts loading and sequencing the override DC offset values 1204 rather than the stored DC offset values 1142. As is further illustrates, the sequencing depends on the slidestep value 1138. Simulation 1200 uses 8 steps and therefore in this simulation, two of the override values 1204 are not used. Other embodiments can use different arrangements of registers. As is discussed above, the override values 1204 can, for example, be downloaded to override registers in memory 634 using an I2C interface with processor 626.

FIG. 12B illustrates transition of the override flag 1206 to low. Once override flag 1206 is disabled, the next PRF cycle starts loading and sequencing the DC offset values in DAC code 1202 instead of the override values.

The above detailed description is provided to illustrate specific embodiments of the present invention and is not intended to be limiting. Numerous variations and modifications within the scope of the present invention are possible. The present invention is set forth in the following claims.

What is claimed is:

1. A method of pulsed radar operation, comprising an operation state, the operation state comprising:
   transmitting a train of pulses, the train of pulses including a plurality of pulses each of the plurality of subsequent pulses having a pulse width and being separated from adjacent pulses of the plurality of pulses by a periodic repetition interval;
   selecting a current integration window from a set of integration windows, each of the integration windows in the set of integration windows opening at a specified time for a specified duration between a transmit pulse and a next transmit pulse of the train of pulses the specified time and the specified duration for each of the integration windows being configured such that the integration windows do not overlap any of the pulses in the plurality of pulses;
   initializing parameters for the current integration window;
   providing the specified timing for the current integration window to an integrating filter, the specified timing being based from the transmit pulse, the integrating filter receiving a reflection signal between the transmit pulse and the next transmit pulse;
   providing a DC offset associated with the current integration window, wherein the reflection signal is offset by the DC offset during the current integration window;
   receiving the reflection signal during the current integration window; and
   incrementing the current integration window to the next integration window in the set of sliding windows, the next integration window to be timed from the next transmit pulse,
   wherein a reflected pulse in the reflection signal is received in at least one integration window of the set of integration windows.

2. The method of claim 1, wherein initializing parameters for the integration window comprises:
   setting timing for opening and closing integration of the current integration window according to the specified time and specified duration of the current integration window;
   retrieving the DC offset from stored DC offset values for the current integration window.

3. The method of claim 2, wherein the stored DC offset values are calibrated values determined from calibrating DC offset values of the pulsed DC radar.

4. The method of claim 3, further including a calibration state to determine the calibrated DC offset values when prompted, the calibration state comprising:

for each of a set of N integration windows,
initializing integration window timing parameters for a current integration window;
initialization a DC offset value for the current integration window;
providing window timing to an integration filter;
providing the DC offset value to a mixer coupled to provide a signal to the integration filter;
receiving an output signal from the integration filter with a sample-and-hold (SAH) circuit;
adjusting the DC offset values while monitoring a comparator output signal from a comparator coupled to receive a SAH signal from the SAH circuit until the DC offset values have converged; and
storing the DC offset value associated with the current integration window.

5. The method of claim 4, wherein adjusting the DC offset values includes bit-wise adjusting the value while determining whether the comparator output signal indicates that the SAH signal has transitioned between above zero and below zero.

6. The method of claim 2, wherein the stored DC offset values are override values that are used when an override enable flag is set.

7. The method of claim 1, wherein the current integration window is cycled through a set of integration windows, moving from a first integration window to a second integration window on successive transmit pulses.

8. The method of claim 7, wherein successive integration windows of the set of integration windows have an overlap period in timing parameters.

9. The method of claim 8, wherein the overlap period is sufficient for settling of receiver functions.

10. A pulsed radar system, comprising:
a transmitter configured to generate a train of pulses, the train of pulses including a plurality of pulses each of the plurality of subsequent pulses having a pulse width and being separated from adjacent pulses of the plurality of pulses by a periodic repetition interval;
receiving amplifiers configured to receive RF signals provide an RF input signal;
a mixer configured to receive an RF oscillation signal, the RF input signal, and a DC offset signal, the mixer providing a mixer output signal that is the result of downconverting the RF input signal with the RF oscillation signal and DC offsetting the result by the DC offset signal;
a digital-to-analog converter (DAC) that receives a digital DC offset value and provides the DC offset signal;
an integrating filter coupled to receive the mixer output signal, the integrating filter receiving an integration window timing signal and operating when an integration window is open to produce a filtered output signal;
a sample-and-hold (SAH) circuit coupled to receive the filter output signal from the integrating filter and providing an SAH signal;
a comparator coupled to receive the SAH signal and provide a comparator signal indicating whether the SAH signal is above or below zero; and
a controller coupled to the DAC to provide the digital DC offset value and to the integrating filter to provide the integration window timing signal opening and closing the integration window and to the comparator to receive the SAH signal, the controller executing instructions to
execute an operation state that provides the integration window that is determined from a set of integration windows, each of the integration windows in the set of integration windows opening at a specified time for a specified duration between a transmit pulse and a next transmit pulse of the train of pulses, the specified time and the specified duration for each of the integration windows being configured such that the integration windows do not overlap any of the pulses in the plurality of pulses, the integration window being incremented on each transmit pulse and being provided with the DC offset value associated with the integration window, wherein a reflected pulse is received in at least one integration window of the set of integration windows, and
execute a calibration state that determines calibrated DC offset values for each integration window in the set of integration windows.

11. The system of claim 10, wherein the operation state comprises:
initializing parameters for a current integration window;
providing timing for the current integration window to an integrating filter based from the transmit pulse;
providing a DC offset associated with the current integration window; and
incrementing the current integration window to the next integration window to be timed from a next transmit pulse.

12. The system of claim 10, wherein the calibration state comprises:
for each of a set of N integration windows,
initializing integration window timing parameters for a current integration window;
initialization a DC offset value for the current integration window;
providing window timing to an integration filter;
providing the DC offset value to a mixer coupled to provide a signal to the integration filter;
receiving an output signal from the integration filter with a sample-and-hold (SAH) circuit;
adjusting the DC offset values while monitoring a comparator output signal from a comparator coupled to receive a SAH signal from the SAH circuit until the DC offset values have converged; and
storing the DC offset value associated with the current integration window.

13. The system of claim 10, wherein the controller is coupled to a processor, wherein the processor can provide override DC offset values.

\* \* \* \* \*